(12) United States Patent  (10) Patent No.: US 12,260,583 B2
Najarian et al.  (45) Date of Patent: Mar. 25, 2025

(54) 3D FIDUCIAL FOR PRECISION 3D NAND CHANNEL TILT/SHIFT ANALYSIS

(71) Applicant: FEI Company, Hillsboro, OR (US)

(72) Inventors: Mark Najarian, Hillsboro, OR (US); Victoriea Bird, Hillsboro, OR (US); Peter D. Carleson, Hillsboro, OR (US); Sean Morgan-Jones, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 365 days.

(21) Appl. No.: 17/171,781

(22) Filed: Feb. 9, 2021

(65) Prior Publication Data

US 2022/0254060 A1  Aug. 11, 2022

(51) Int. Cl.
| | |
|---|---|
| *G06T 7/73* | (2017.01) |
| *G06T 7/33* | (2017.01) |
| *G06T 7/55* | (2017.01) |
| *G06T 7/66* | (2017.01) |
| *G06T 17/10* | (2006.01) |
| *H01J 37/20* | (2006.01) |
| *H01J 37/22* | (2006.01) |
| *H01J 37/28* | (2006.01) |
| *H10B 41/27* | (2023.01) |
| *H10B 43/27* | (2023.01) |

(52) U.S. Cl.
CPC .............. *G06T 7/74* (2017.01); *G06T 7/33* (2017.01); *G06T 7/55* (2017.01); *G06T 7/66* (2017.01); *G06T 17/10* (2013.01); *H01J 37/20* (2013.01); *H01J 37/222* (2013.01); *H01J 37/28* (2013.01); *G06T 2207/10061* (2013.01); *G06T 2207/20108* (2013.01); *G06T 2207/30148* (2013.01); *G06T 2210/56* (2013.01); *H01J 2237/20292* (2013.01); *H01J 2237/31745* (2013.01); *H10B 41/27* (2023.02); *H10B 43/27* (2023.02)

(58) Field of Classification Search
None
See application file for complete search history.

(56) References Cited

U.S. PATENT DOCUMENTS

| | | | | |
|---|---|---|---|---|
| 6,429,090 B1* | 8/2002 | Fujiwara | ............. | H01J 37/3045 257/E23.179 |
| 11,694,322 B2* | 7/2023 | Zhong | ................... | G06V 10/40 382/141 |
| 2006/0103035 A1* | 5/2006 | Maruyama | .......... | H01J 37/3045 257/E23.179 |

(Continued)

*Primary Examiner* — Tyler W. Sullivan
(74) *Attorney, Agent, or Firm* — Michael Best & Friedrich LLP

(57) ABSTRACT

Systems for and methods for generating precise structure reconstruction using slice and view images, are disclosed. An example method comprises, obtaining a slice and view images of a sample that depicts a 3D fiducial and cross-sections of a structure in the sample. The 3D fiducial is configured such that when a layer of material having a uniform thickness is removed from a surface of the sample that includes the 3D fiducial the cross-sectional shape of the 3D fiducial in the new surface is consistent. Relative positions are determined between the 3D fiducial the cross-sections of the structure in individual images. Positional relationships are then determined between the cross-sections of the structure in different images in a common reference frame based on the relative positions.

17 Claims, 10 Drawing Sheets

(56) References Cited

U.S. PATENT DOCUMENTS

| | | | |
|---|---|---|---|
| 2007/0018099 A1* | 1/2007 | Chitturi | G01B 15/08 |
| | | | 250/492.21 |
| 2014/0190006 A1* | 7/2014 | Setomoto | H05K 3/4679 |
| | | | 29/852 |
| 2016/0133434 A1* | 5/2016 | Kuramoto | G06V 10/751 |
| | | | 250/306 |
| 2017/0025246 A1* | 1/2017 | Bouchet-Marquis | |
| | | | H01J 37/222 |
| 2022/0223445 A1* | 7/2022 | Avishai | H01J 37/28 |
| 2022/0392734 A1* | 12/2022 | Sarov | H01J 37/09 |
| 2022/0392793 A1* | 12/2022 | Buxbaum | G06T 7/50 |

\* cited by examiner

1500

1600

3D FIDUCIAL FOR PRECISION 3D NAND CHANNEL TILT/SHIFT ANALYSIS

BACKGROUND OF THE INVENTION

Sample evaluation to identify viable solutions and failure analysis to identify system defects are two microscopy processes that are crucial to the development of new semiconductor/memory technologies. For example, by using microscopy techniques a sample system can be evaluated to identify errors in design and/or manufacture. A common technique for performing such an evaluation is slice and view imaging, where a layer of material from the surface of a sample is repeatedly removed, and between such removals the revealed surface of the sample is imaged. By repeatedly removing the topmost layer of the sample and then reviewing the revealed surface, slice and view processes allow for users to obtain a collection of images of cross-sections of the sample at periodic depths below the initial sample surface. These collections of images may then be used to generate 3D models of the sample and/or otherwise evaluate the design and manufacture of structures within the sample at multiple depths. However, as the size of the structural components of semiconductor/memory technologies continue to decrease, it has become difficult to align such slice and view images within a common reference frame. For example, for structures having variations in the range of 5-100 nm, present systems and processes struggle to align such images within a level of precision that can capture these minute variations.

One current solution to this issue is to have a surface fiducial milled into a surface location proximate to the region of the sample being imaged using slice and view techniques. The surface fiducial is located with the microscope, and then a known translation is applied via a sample holder such that the microscope is able to evaluate the newly revealed surface of the sample. Because the region of the sample containing the surface fiducial is not removed, its location in the reference frame remains constant, and each image is known to be offset by the surface fiducial by the amount of the known translation. Unfortunately, with current semiconductor/memory technologies, the physical translation of the sample holder introduces a degree of error that often exceeds the minute structure variations that microscope users are attempting to discover.

Another current solution is to reduce the layer of material that is removed between each iteration of imaging. While this reduction in the amount of layer removed simplifies image alignment by reducing the expected differences between images, this technique does not capture global drifts of structures within the sample. That is, if all structures in the sample drift in a common direction current software techniques will align the images to remove such a drift in the sample structures. Additionally, reducing the thickness of material removed between images drastically increases the amount of time necessary to review samples, while also driving up costs due to the need for highly tuned milling systems. Accordingly, there is a desire for improved microscopy systems and methods for more accurate alignment of images obtained via slice and view imaging.

SUMMARY

Systems for and methods for generating precise structure reconstruction using slice and view images, are disclosed. An example method for generating precise structure reconstruction using slice and view images according to the present invention comprises, obtaining a first slice and view image of a first surface of the sample that depicts a 3D fiducial and a first cross-section of a structure in the sample, and obtaining a second slice and view image of a second surface of the sample that depicts the 3D fiducial and a second cross-section of the structure. The 3D fiducial is configured such that when a layer of material having a uniform thickness is removed from a surface of the sample that includes the 3D fiducial the cross-sectional shape of the 3D fiducial in the new surface is consistent. For example, the 3D fiducial may be a milled void having the shape of a prism. In this way, due to the known shape of the void throughout the sample, the location of the cross-section within images of each depth can be calculated in a common reference frame. Methods further include determining, based on the first image, a first relative position between the 3D fiducial in the first image and the first cross-section of the structure, and then determining, based on the second image, a second relative position between the 3D fiducial in the second image and the second cross-section of the structure. Because the global position of the cross-section of the 3D fiducial can be determined within a single reference frame, a positional relationship between the first cross-section of the structure and the second cross-section of the structure can then be determined based on the first relative position and the second relative position. In some embodiments, methods according to the present disclosure further include milling a 3D fiducial in the sample, and conducting slice and view imaging of a region of the sample that includes the 3D fiducial.

Charged particle microscope systems for generating precise structure reconstructions using slice and view images according to the present inventions comprise a sample holder configured to hold a sample, an electron beam source configured to emit an electron beam toward the sample, an electron beam column configured to direct the electron beam onto the sample, a delayering component configured to remove layers from the surface of the sample, and one or more detectors configured to detect emissions resultant from the electron beam irradiating the sample. Charged particle microscope systems further include one or more processors, and a memory storing instructions that when executed on the one or more processors causes the charged particle microscope system to obtain a first slice and view image of a first surface of the sample that depicts a 3D fiducial and a first cross-section of a structure in the sample, obtain a second slice and view image of a second surface of the sample that depicts the 3D fiducial and a second cross-section of the structure, determine, based on the first image, a first relative position between the 3D fiducial in the first image and the first cross-section of the structure, determine, based on the second image, a second relative position between the 3D fiducial in the second image and the second cross-section of the structure, and then determine a positional relationship between the first cross-section of the structure and the second cross-section of the structure based on the first relative position and the second relative position.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
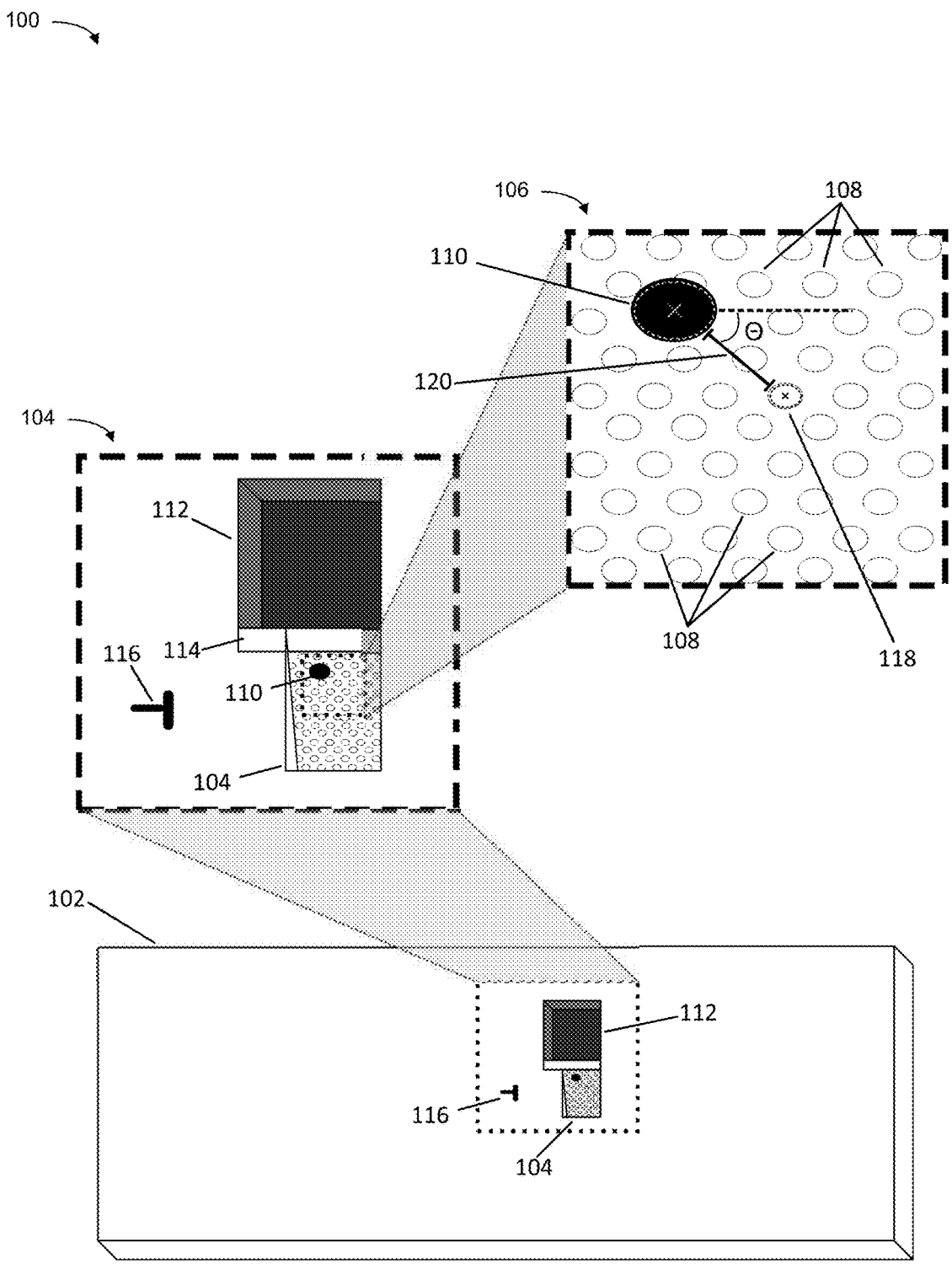
FIG. 1 schematically illustrates a sample that has been evaluated using systems and methods for generating precise structure reconstruction using slice and view images, according to the present disclosure.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Methods and systems for generating precise structure reconstruction using slice and view images, are disclosed. Specifically, the methods and systems involve use of a 3D fiducial milled in the sample that allows structures from separate slice and view images to be precisely aligned within a single reference frame. The 3D fiducial is configured such that when a layer of material having a uniform thickness is removed from a surface of the sample including the 3D fiducial, the positional center of gravity (i.e., representative positional value(s) for the cross section of a 3D fiducial in individual slice and view images) of the 3D fiducial in the new surface is consistent (i.e., the same or substantially the same). For example, the 3D fiducial may be a milled void having the shape of a prism. In this way, due to the known shape of the void throughout the sample, the location of the cross-section within images of each depth can be calculated in a common reference frame. Because the methods and systems according to the present invention utilize this 3D fiducial, they are capable of precisely aligning slice and view images to identify system variations/defects as small as 5-100 nm.

FIG. 1 is a schematic illustration of a sample 100 having been evaluated using systems and methods for generating precise structure reconstruction using slice and view images, according to the present disclosure. Specifically, FIG. 1 shows a sample 102 in which a region of interest 104 is being evaluated using systems and methods of the present disclosure. FIG. 1 further shows multiple inset views 106 and 108 that show magnified views of corresponding areas to allow for greater understanding of the systems and methods of the present disclosure. The region of interest 104 is shown as being a portion of the surface of sample 102 in which slice and view imaging is being performed to reveal structures 108 within the sample. FIG. 1 illustrates the sample 102 as corresponding to a 3D NAND chip containing channel structures 108, however other types of samples comprising structures (biological samples, lamellas, wafers, semiconductor chips, memory chips, etc.) may be evaluated with the systems and methods of the present disclosure.

The region of interest 104 includes a 3D fiducial 110. The 3D fiducial 110 is a fiducial having a shape such that when a layer of material having a uniform thickness is removed from the region of interest 104, the positional center of gravity of the cross-sectional shape of the 3D fiducial 110 in the new surface is consistent. That is, the 3D fiducial 110 is a fiducial that has a depth along a central axis (e.g., z-axis) that is greater than or equal to the depth of the sample 102 being evaluated, where the shape of the 3D fiducial's 110 cross-sections is the same in parallel cross-sections of different depths of the sample 102. An example of such a 3D fiducial 110 is a void having a substantially prismatic shape. Another example of such a 3D fiducial 110 is a void that has been tooled into the sample and then had a material deposited in the void to form a reference structure having a substantially prismatic shape. In some embodiments, the 3D fiducial 110 may be generated by milling with a focused ion beam (FIB) and/or spot burned into the sample with an electron beam to such a depth that a cross-section of the 3D fiducial 110 is present in each of a set of slice and view images of the region of interest 104.

Within the present disclosure, the term substantially is used to convey the idea that the corresponding adjective is true within a degree of approximation that a person having skill in the art would understand allows for the functionalities described in association with the disclosed systems and methods to still be achieved. For example, where the 3D fiducial is described as being substantially prismatic in shape, a person having skill in the art would understand that tooling limitations would likely result in the cross-section of the 3D fiducial decreasing in size as the corresponding depth of the increased. However, it is understood that the difference in cross-section between images in such an example are still within a degree of similarity that recognize them as being the same shape. Additionally, a person having skill in the art would appreciate that a 3D fiducial 110 created by a spot burn of the sample 102 would result in a 3D fiducial with a cross shape that gradually decreases in size, and would likely taper to a point and not terminate in a second end face. However, according to the present disclosure such the shape of such a 3D fiducial would be considered substantially prismatic.

FIG. 1 illustrates 3D fiducial 110 as having substantially the shape of a prism with an ovoid cross-section revealed by the diagonal milling of the sample region of interest 104. In other embodiments the shape of the prism may have any other recognizable cross-sectional shape (e.g., square, cross, circular, polygonal, other irregular shape) that is consistent (i.e., substantially the same size and shape) along its central axis (e.g., z-axis). In some embodiments, the central axis (e.g., z-axis) of the 3D fiducial may be substantially perpendicular to the surface of the sample 102, substantially parallel to the imaging axis of the charged particle system being used to evaluate the sample, or both.

Because the 3D fiducial 110 has substantially the same cross-section a different depths along its central axis (e.g., z-axis), in slice and view images of the region of interest 104 that include the 3D fiducial 110, the cross-section of the 3D fiducial 110 will have substantially the same size, shape, and resulting positional center of gravity. This allows the 3D fiducial 110 to be easily identified within individual slice and view images of the region of interest 104. For example, the 3D fiducial 110 may be located within individual slice and view images of the region of interest 104 using a fitting algorithm, pattern recognition, users selection, or other known methodology.

Additionally, because parallel cross-sections of the 3D fiducial 110 are substantially the same at different depths of the central axis (e.g., z-axis) of the 3D fiducial 110, and because the orientation of the central axis (e.g., z-axis) is known or can be determined, the depth at which each corresponding image was taken can be used to align the images into a common reference frame. In other words, because the central axis of the 3D fiducial 110 is known, the location of the cross-section of the 3D fiducial 110 different slice and view images can be used to align or otherwise interrelate slice and view images according to their corresponding depths.

FIG. 1 illustrates the sample 102 as having been evaluated using slice and view process comprising a diagonal milling of material from the region of interest 104. However, in other embodiments different types of milling processes (e.g., top down milling) may be used. FIG. 1 shows a void 112 optionally having been milled proximate to the region of interest 104, and a material 114 having been optionally deposited on a wall of the void 112 proximate to the region of interest 104. The void 112 may allow a FIB to perform an angled milling of the region of interest 104. Additionally, the optional deposited material 114 may reduce curtaining and/or other types of damage to the surface of the region of interest 114 during such a diagonal milling. FIG. 1 also shows an optional surface fiducial 116 located proximate to the region of interest 104 in a region of the sample 102 that is not removed during slice and view processing. The optional surface fiducial 116 may be used as a reference when locating the region of interest 104 and/or the 3D fiducial 110 during slice and view processing.

Inset view 106 further depicts how structures 108 within different slice and view images may be aligned in a common reference frame according to the present disclosure. Specifically, inset view 106 shows how the relative position between of the cross-section of the 3D fiducial 110 and a structure of reference 118. Initially, the locations (e.g., their center, a point location, an average position, a center of mass, etc.) of the 3D fiducial 110 and the structure of reference 118 are located within an individual slice and view image. The locations and/or centers may be identified by user interactions, pattern recognition algorithms, image recognition algorithms, or a combination thereof. For example, a pattern recognition algorithm and a cylindrical fit algorithm may be used to locate the position and/or center of one or both of the 3D fiducial 110 and the structure of reference 118.

Once the locations of the fiducial 110 and the structure of reference 118 (or their centers) within an image are known, the relative position 120 of the structure of reference 118 in view of the 3D fiducial 110 is determined. The relative position 120 may correspond to a vector, a translation, a distance, and/or a coordinate difference within the plane of the first surface depicted in the first image. Additionally, determining the first relative position may also include determining a scale image based on one or more of a magnification value of the image or a physical feature of the cross-section of the 3D fiducial 110 in the corresponding image. For example, because the cross-sections of the 3D fiducial 110 is expected to be the same at each depth, individual slice and view images may be scaled such that the 3D fiducial 110 that it depicts is the expected size and/or shape.

Once the relative position 120 between the structure of reference 118 and the 3D fiducial 110 is determined for two slice and view images, the depth of the images may be used to determine the positional relationship between the structure of reference 118 as depicted in the two slice and view images. That is, because the cross-section of the 3D fiducial 118 is substantially uniform along the central axis (e.g., z-axis), and because the orientation of this axis is known, the depths of each image can be used to determine the positional relationships between the 3D fiducial 110 as depicted in the two images, which may then be used to obtain relative positional relationship between the structure of reference 118 as depicted in the two images.

For example, where the central axis (e.g., z-axis) of the 3D fiducial 110 is normal to the imaging axis of the charged particle system, the relative position between the 3D fiducial 110 in each slice and view image is the same. Thus, the positional relationship between the structure of reference 118 in two such slice and view images is equal to the difference between the relative positions 120 determined for the two images plus the difference between the depths of the two images. Alternatively, where the central axis (e.g., z-axis) of the 3D fiducial is not normal to the imaging axis of the charged particle system, an offset may be determined between the central axis and the imaging axis may be determined. This offset may then be used to determine the relative positions of the locations and/or centers of the reference structure 118 in different slice and view images.

FIG. 1 illustrates the charged particle beam path 104 as traveling along a z-axis, and the cross-section of the optical component 102 as being bisected by an xy-plane. The optical component 102 comprises an inner core 106 composed of an electrically isolating material. In various embodiments, the inner core 106 may be composed of various electrically resistant materials such as a ceramic material, a vitreous material, quartz, a semiconductor material, etc. A person having skill in the art would understand that this list of potential electrically resistant materials is not exhaustive, and that various electrically isolating materials (and/or combinations thereof) may be selected according to the function of the optical element or the system in which it resides.

Figure 2:
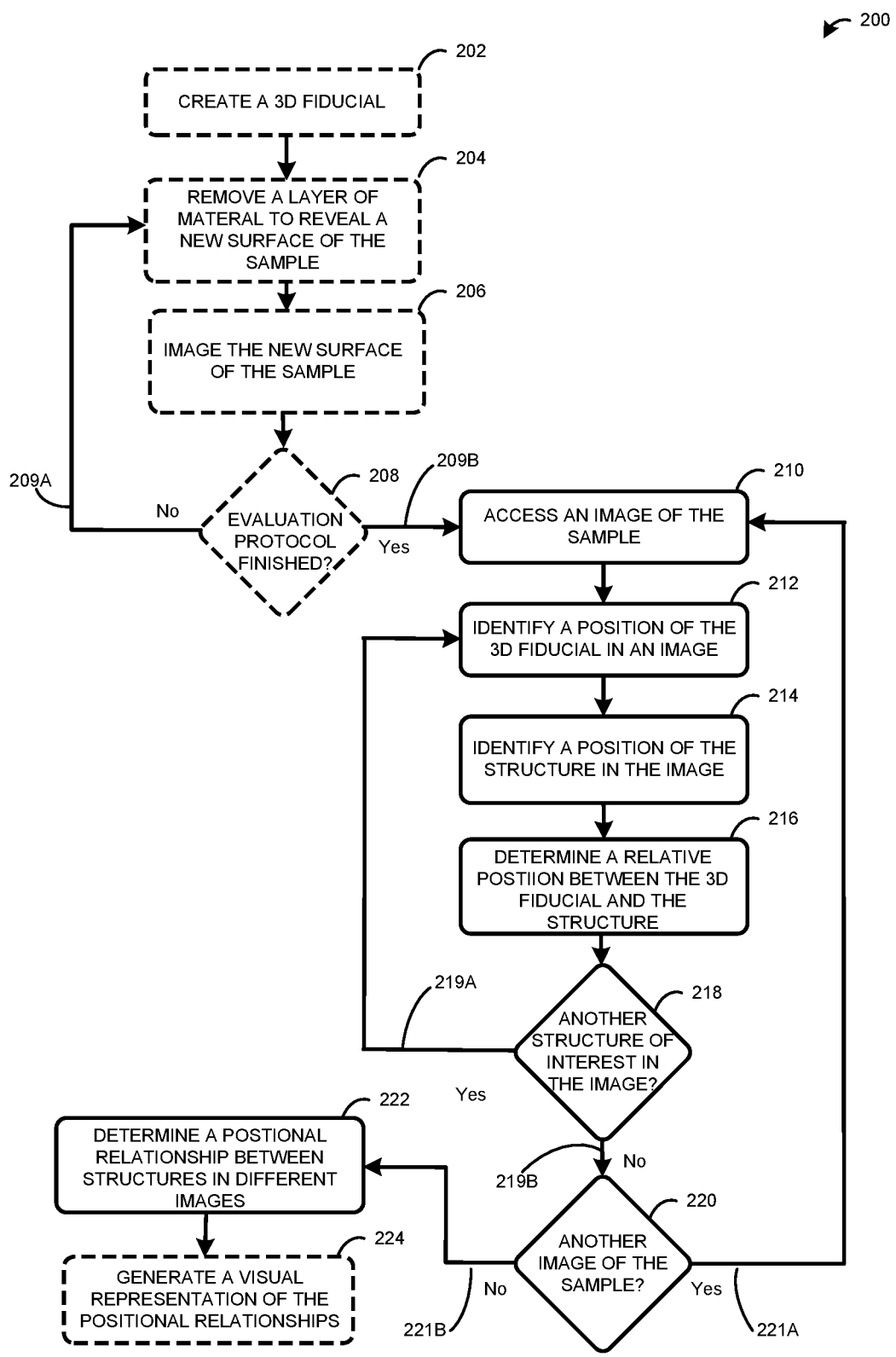
FIG. 2 depicts a process for generating precise structure reconstructions using slice and view images using a 3D fiducial.

FIG. 2 is a flow diagram of illustrative processes depicted as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

Specifically, FIG. 2 is a flow diagram of an illustrative process 200 for generating precise structure reconstruction using slice and view images using a 3D fiducial. The process 200 may be implemented in environment 1400 and/or by one or more computing device(s) 1408, and/or by a computing architecture, and/or in other environments and computing devices as described herein with respect to FIG. 14.

At 202, a 3D fiducial is created in through a region of interest of the sample. The 3D fiducial is a fiducial having a shape such that when a layer of material having a uniform thickness is removed from the region of interest, the cross-sectional shape of the 3D fiducial in the revealed surface is consistent. The 3D fiducial may have a depth along a central axis (e.g., z-axis) that is greater than or equal to the depth of the region of interest being evaluated. The 3D fiducial may be a void having a substantially prismatic shape. In such embodiments, the 3D fiducial may be created by milling with a FIB and/or performing a spot burn into the sample with an electron beam to such a depth that a cross-section of the 3D fiducial will be present in a set of slice and view images of the region of interest. Alternatively, the 3D fiducial may be a reference structure having a substantially prismatic shape that is generated by depositing a material into a void that has been tooled into the sample.

At 204, a layer of material is removed from the surface of the sample to reveal a new surface. In this step a layer of material having a uniform thickness. The process of removing/delayering the surface of the sample may include removing the material with a focused ion beam (FIB), or other mechanisms, such as an electron beam, a laser, a diamond blade, etc. For example, a FIB may be used to mill away the topmost 20 nm of material from the region of interest.

At 206, an image of the new surface of the sample is obtained. Specifically, scanning electron microscopy (SEM) imaging may be used to generate an image of the new surface of the region of interest that was exposed by the removal of material in step 204. During the SEM imaging an electron beam is scanned across the surface of region of interest, and a detector detects emissions resultant from the sample being irradiated by the electron beam.

At 208, it is determined whether the slice and view evaluation protocol has been completed. This may correspond to determining if a predetermined number of images have been obtained, whether a predetermined depth of the sample has been evaluated, whether a predetermined volume has been removed from the sample, or other way of monitoring the progress of slice and view processing. If the answer at 208 is no ("No" branch 209A), then the process returns to step 204 and another layer of material is removed from the surface of the sample. If it is determined at step 208 that the evaluation protocol is finished ("Yes" branch 209B), the process continues to step 210, and an image of the sample is accessed.

At 210, an image of the sample is accessed. The image may be obtained by a computing device by a wired or wireless connection (e.g., a WAN, a LAN, a cable hookup, etc.), or from another memory device storing the training data (e.g., another computer memory, a local memory, a hard drive, a CD-ROM, a portable memory device, etc.).

At 212, a position of the 3D fiducial in the image is identified. Identifying the position of the 3D fiducial in the image may correspond to determining the center of the 3D fiducial, a center of mass, an average position, a position further from an edge. The locations and/or centers may be identified by user interactions, pattern recognition algorithms, image recognition algorithms, or a combination thereof. For example, a pattern recognition algorithm may be used to identify the 3D fiducial within the image, and a cylindrical fit algorithm may be used to locate the center point of the 3D fiducial.

At 214, a position of a structure in the image is identified. Identifying the position of the structure in the image may correspond to determining the center of the structure, a center of mass, an average position, a position further from an edge. The locations and/or centers may be identified by user interactions, pattern recognition algorithms, image recognition algorithms, or a combination thereof. For example, a pattern recognition algorithm may be used to identify the structure within the image, and a fit algorithm may be used to locate the center point of the structure.

At 216, a relative position between the 3D fiducial and the structure is determined. For example, determining the relative position may comprise determining one of a vector, a translation, a distance, and/or a coordinate difference between the position of the 3D fiducial in the image and the position of the structure in the image. In some embodiments, determining the relative position also includes scaling the image according to the 3D fiducial as depicted in the image. Because the cross-section of the 3D fiducial is consistent across the multiple surfaces imaged via slice and view imaging, there is an expected size of the 3D fiducial across the slice and view images. Thus individual images may be scaled so that the cross-section of the 3D fiducial matches the expected size, thus ensuring that the slice and view images are of a common scale.

At 218, it is determined whether there is another structure of interest in the image. This may correspond to determining if a predetermined number of structures have been evaluated, if an image recognition algorithm has indicated an additional structure, a pattern recognition algorithm determining that another structure is present in the image, or another method for determining whether each structure of interest in the image has been evaluated. If the answer at 218 is yes ("Yes" branch 219A), then the process returns to step 214 and the position of the additional structure is determined. If it is determined at step 218 that there are not additional structures to be evaluated ("No" branch 219B), the process continues to step 220, and it is determined whether there another slice and view image of the sample to be processed. If it is determined in step 220 that an additional slice and view image is to be evaluated ("Yes" branch 221A), then the process returns to step 210 and additional slice and view image is accessed.

If it is determined at step 220 that there are no additional slice and view images to be evaluated ("No" branch 221B), the process continues to step 222, and a positional relationship between structures in different images is determined. That is, because the cross-section of the 3D fiducial is substantially uniform along its central axis (e.g., z-axis), and because the orientation of this central axis is known, the depths of each image can be used to orient/align the images in a common reference frame (i.e., determine the global geometric relationship between each of the images). In this way, systems and methods according to the present disclosure are able to use the depth associated with each slice and view image and the known orientation of the central axis to place the positions of the 3D fiducials within each image in a common reference frame. Once the images are positioned and/or oriented within this common reference frame, the positional relationships between structures in different images can be obtained.

Alternatively or in addition, determining the positional relationships between two instances of a structure depicted in two images may include determining the global geometric relationship between the cross-sections of the 3D fiducials in each of the two images, and then determining a difference between the relative positions between the 3D fiducial and the structure determined for each of the two images. By combining the global geometric relationship with the difference between the relative positions systems and methods according to the present disclosure are able to determine with great precision the positional relationship between two instances of a structure depicted in two slice and view images.

For example, where the central axis (e.g., z-axis) of the 3D fiducial is normal to the imaging axis of the charged particle system, the global geometric relationship would correspond to the difference in the depths between the two images along the imaging axis. Thus, the positional relationship between the structure of reference in two such slice and view images is equal to the difference between the relative positions determined for the two images plus the difference between the depths of the two images. The depth of individual images may be determined based on the size of the cross-section of the 3D fiducial in the surface, a number of layers removed from the sample, the thickness of layers removed from the sample, the height of the sample being evaluated, the number of slice and view images of the sample obtained, the distance between a first 3D fiducial and a second 3D fiducial, or a combination thereof. Alternatively, where the central axis (e.g., z-axis) of the 3D fiducial is not normal to the imaging axis of the charged particle system, an offset may be determined between the central axis and the imaging axis may be determined. This offset may then be used to determine the relative positions of the locations and/or centers of the reference structure in different slice and view images.

At 224, a visual representation of the positional relationships is generated. In various embodiments, the generated visual representation may correspond to a table of positional relationships for structures within the sample, a graph of positional relationships for structures within the sample, 3D reconstructions of one or more structures, a 3D reconstruction of the sample, or a combination thereof. Examples of some potential visual representation of the positional relationships are shown in FIGS. 6-13. The visual representation of the positional relationships may be used to determine one or both of variation and/or drift of structures in the sample compared to an expected shape or position. Alternatively, such a variation and/or drift may be determined from the positional relationships themselves. In this way, the positional relationships and/or the visual representations can be used to diagnose errors in manufacture and/or techniques used to generate the sample. Moreover, because of the precision of the alignment of the slice and view images using the systems and methods of the present disclosure, the positional relationships and/or the visual representations are able to evaluate the design and manufacture of structures that are to small to evaluate using present technologies.

Figure 3:
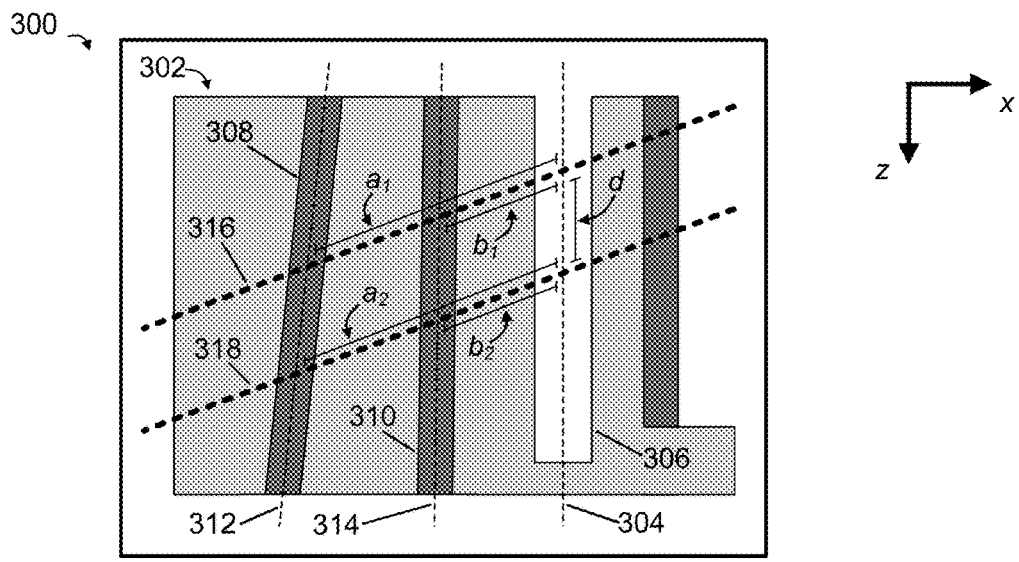
FIGS. 3-5 schematically illustrate the determination of global positional relationships between structures within different images using a 3D fiducial, according to the present disclosure.
Figure 4:
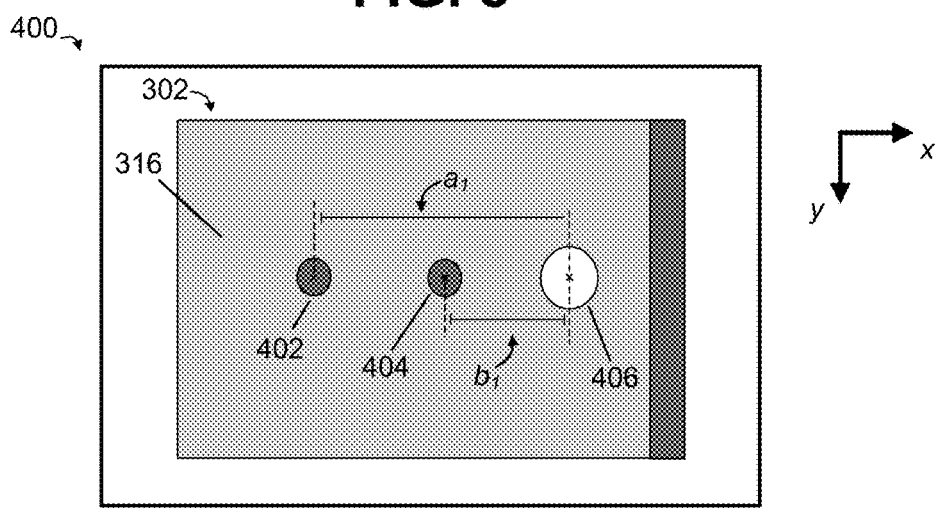
Figure 5:
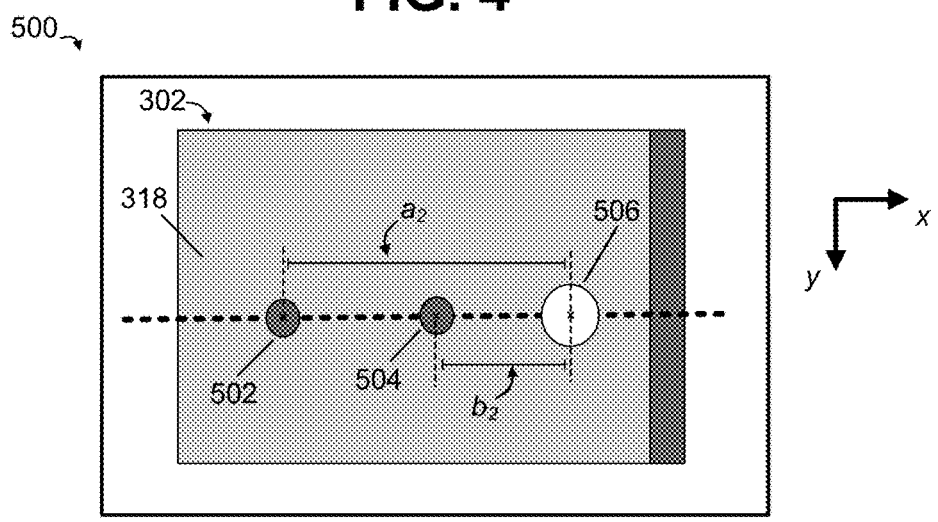

FIGS. 3-5 are schematic drawings that illustrate the determination of global positional relationships between structures within different images using a 3D fiducial, according to the present disclosure. For example, FIG. 3 illustrates a cross-sectional view 300 of a sample 302 being evaluated using methods and system of the present disclosure. The cross-section displayed is along a z/y plane, where the z-axis corresponds to the central axis 304 of the 3D fiducial 306. The 3D fiducial 306 is configured in the sample 302 such that when a layer of material having a uniform thickness is removed from the surface of the sample 302, the cross-sectional shape of the 3D fiducial 306 in the revealed surface is consistent.

FIG. 3 shows the sample 302 as including a first structure 308 and a second structure 310. Specifically, FIG. 3 shows the first structure 308 and the second structure 310 as being cylindrical channels having a first central axis 312 and a second central axis 314, respectively. Due to the small size and high aspect ratio of these structures, current technologies struggle to determine direct positional relationships and/or the visual reconstructions of such structures using slice and view images. Thus, present technology is unable to provide the precision necessary for operators to evaluate the design and/or manufacture of such structures.

FIG. 3 also illustrates a dashed line 316 that represents a first layer of the sample 302 that is revealed via diagonal milling and then imaged in slice and view processing to generate schematic sample image 400 shown in FIG. 4. Additionally, FIG. 3 illustrates a dashed line 318 that represents a second layer of the sample 302 that is revealed via diagonal milling and then imaged in slice and view processing to generate schematic sample image 500 shown in FIG. 5.

FIG. 3 further depicts visual representations of a first relative position $a_1$ between the 3D fiducial 306 and the first structure 308 in the first layer, a second relative position $b_1$ between the 3D fiducial 306 and the second structure 310 in the first layer 316, a third relative position $a_2$ between the 3D fiducial 306 and the first structure 308 in the second layer 318, and fourth relative position $b_2$ between the 3D fiducial 306 and the second structure 310 in the second layer 318. FIG. 3 also illustrates the global positional relationship d between the position of the 3D fiducial 306 in the first layer 316 and the 3D fiducial 306 in the second layer 318. A person having skill in the art can understand how, because the orientation of the central axis 304 of the 3D fiducial 306 is known, the global positional relationship d can be used to precisely determine the relative position between the location of the second structure 310 in the first layer 316 and the location of second structure 310 in the second layer 318. This same global relationship d may also be used in concert with $a_1$ and $a_2$ to precisely determine the relative position between the location of the first structure 308 in the first layer 316 and the location of first structure 308 in the second layer 318, according to the present disclosure.

FIG. 4 illustrates a schematic slice and view image 400 of the first layer 316 of the sample 302 being evaluated using methods and system of the present disclosure. The image is displayed in an x/y plane. It is noted that the first layer 316 is not shown as being perpendicular to the central axis 304 of the 3D fiducial 306 in FIG. 3. This is merely an exemplary embodiment, and in other embodiments of the methods and systems of the present disclosure the imaged layers may be perpendicular to the central axis 304 of the 3D fiducial 306. Applicant notes that, while the mathematics used to obtain the relative positions are different, the conceptual methodology of the present disclosure is consistent regardless of the relationship between the illustrated x/y plane of the images and the central axis 304 of the 3D fiducial 306.

FIG. 4 shows a cross-section 402 of the first structure 308, a cross-section 404 of the second structure 310, and a cross-section 406 of the 3D fiducial 306. According to the present disclosure, the locations of the cross-sections of the first structure 308, the second structure 310, and the 3D fiducial 306 (and/or their respective centers) may be identified via user interactions, pattern recognition algorithms, image recognition algorithms, or a combination thereof. For example, an image recognition algorithm and a cylindrical fit algorithm may be used to locate the position and/or center of the cross-section 406 of the 3D fiducial 306 in FIG. 4.

Once the locations of the first structure 308, second structure 310, and the 3D fiducial 306 (and/or their respective centers) within the image 400 are known, the relative position $a_1$ between the cross-section 402 and cross-section 406 and the relative position $b_1$ between the cross-section 404 and cross-section 406, are determined. The relative positions may correspond to vectors, translations, distances, and/or coordinate differences within the first image 400.

FIG. 5 illustrates a schematic slice and view image 500 of the second layer 318 of the sample 302 being evaluated using methods and system of the present disclosure. The image is displayed in an x/y plane. As discussed above regarding FIG. 4, it is noted that the second layer 318 is not shown as being perpendicular to the central axis 304 of the 3D fiducial 306 in FIG. 3. This is merely an exemplary embodiment, and in other embodiments of the methods and systems of the present disclosure the imaged layers may be perpendicular to the central axis 304 of the 3D fiducial 306.

FIG. 5 shows a cross-section 502 of the first structure 308, a cross-section 504 of the second structure 310, and a cross-section 506 of the 3D fiducial 306. The locations of the first structure 308, second structure 310, and the 3D fiducial 306 (and/or their respective centers) may be identified via user interactions, pattern recognition algorithms, image recognition algorithms, or a combination thereof. For example, a pattern recognition algorithm and a cylindrical fit algorithm may be used to locate the position and/or center of the cross-section 402 of the first structure 308 and the cross-section 404 of the second structure 310 in FIG. 4.

Once the locations of the first structure 308, second structure 310, and the 3D fiducial 306 (and/or their respective centers) within the image 500 are known, the relative position $a_2$ between the cross-section 502 and cross-section 506 and the relative position $b_2$ between the cross-section 504 and cross-section 506, are determined. The relative positions may correspond to vectors, translations, distances, and/or coordinate differences within the first image 500.

Figure 6:
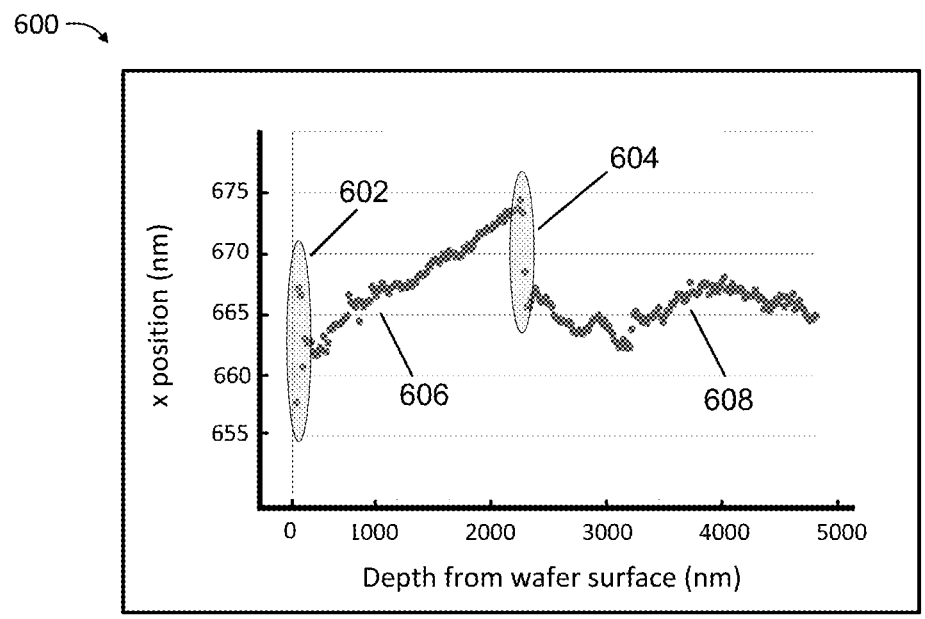
FIGS. 6-11 are graphs that show example visual representations positional relationships of structures within different images of a sample using a 3D fiducial, according to the present disclosure.
Figure 7:
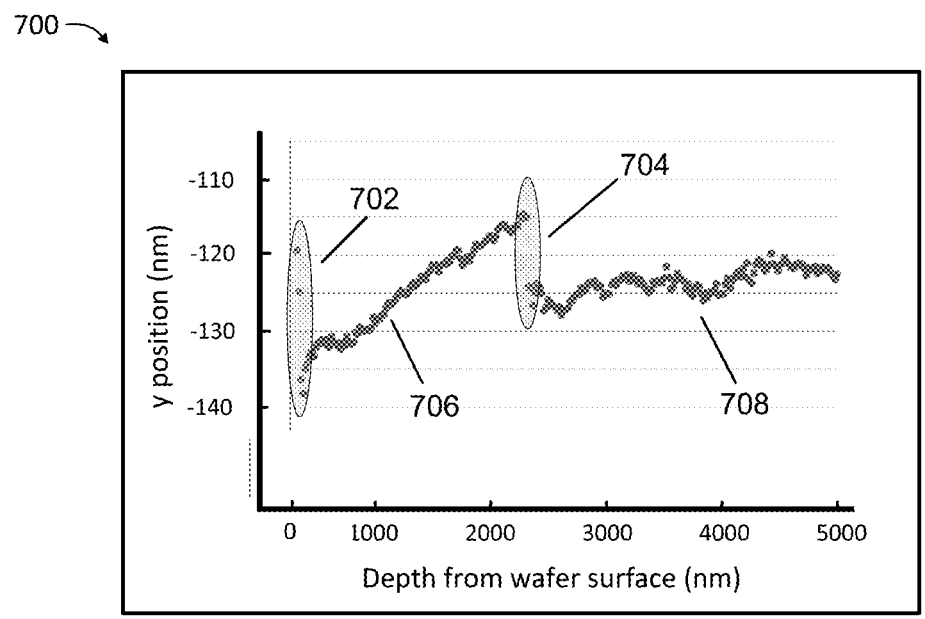

FIGS. 6-11 are graphs that show example visual representations positional relationships of structures within different images of a sample using a 3D fiducial, according to the present disclosure. Specifically, FIGS. 6 and 7 are graphs depicting the relative position of a structure at different depths from the sample surface as determined using methods and systems of the present disclosure in an x dimension 600 and y dimension 700, respectively. More specifically, FIGS. 6 and 7 are graphs depicting the relative position of a channel at different depths from the surface of a 3D NAND wafer.

FIG. 6 shows a first grouping of data points 602 and a second grouping of data points 604 that do not show a close interrelation between the structure at different depths. This is because the first grouping 602 represents the evaluation of a surface layer of the wafer that does not include the channel structure, while the second grouping 604 corresponds to a transition between a first channel in an upper stack of channels in the 3D NAND wafer and a second channel in a lower stack of channels that is positioned below the upper stack in the 3D NAND wafer. Thus, the third grouping 606 corresponds to the x dimensional position of the first channel, and the fourth grouping 608 corresponds to the x dimensional position of the second channel.

The third grouping 606 of data points shows that there is a net drift of ~12 nm in the positive x direction between the surface layer of the wafer and the transition between the upper stack of channels and the lower stack of channels in the 3D NAND wafer. The third grouping 606 further shows that this drift is constant, which may mean that this drift is indicative of a misalignment of the fabrication tool used to create the first channel instead of wobble or imperfection in the performance of the fabrication tool. On the contrary, the fourth grouping 608 of data points shows that there is no net translation of second channel, but that there is a wobble in the path of the channel having an amplitude of ~6 nm as the depth of the second channel increases. This may be indicative of a wobble or imperfection in the performance of the fabrication tool used to create the second channel (e.g., vibration of the tool during performance, change of temperature of the tool, etc.), and/or that the alignment of the fabrication tool used to correct the channel was constant. FIG. 6 further shows that there is a slight misalignment between the first channel and the second channel. Moreover, graph 600 indicates that this misalignment is in the order of ~8 nm.

Similarly, FIG. 7 shows a first grouping of data points 702 and a second grouping of data points 704 that do not show a close interrelation between the structure at different depths. This is because the first grouping 702 represents the evaluation of a surface layer of the wafer that does not include the channel structure, while the second grouping 704 corresponds to a transition between a first channel in an upper stack of channels in the 3D NAND wafer and a second channel in a lower stack of channels that is positioned below the upper stack in the 3D NAND wafer. The third grouping 706 corresponds to the y dimensional position of the first channel, and the fourth grouping 708 corresponds to the y dimensional position of the second channel.

The third grouping 706 of data points shows that there is a net drift of ~21 nm in the positive y direction between the surface layer of the wafer and the transition between upper stack of channels and the lower stack of channels in the 3D NAND wafer. The third grouping 706 further shows that this drift is constant, which may mean that this drift is indicative of a misalignment of the fabrication tool used to create the first channel instead of wobble or imperfection in the performance of the fabrication tool. The fourth grouping 708 of data points shows that there is slight net drift of ~3 nm of second channel in the positive y direction. The fourth grouping 708 further shows that there was a slight wobble in the second channel having an amplitude of ~4 nm between the depths of ~2500 nm and ~2800 nm, and a shift in the second channel of about ~4 nm between the depths of ~3900 nm and ~4300 nm. FIG. 7 also shows that there is a slight misalignment between the first channel and the second channel in the order of ~11 nm. It should be noted that FIGS. 6 and 7 show that the methods and systems according to the present disclosure can us a 3D fiducial to precisely align slice and view sample images so that structural variations on the order of a few nanometers are detectable.

Figure 8:
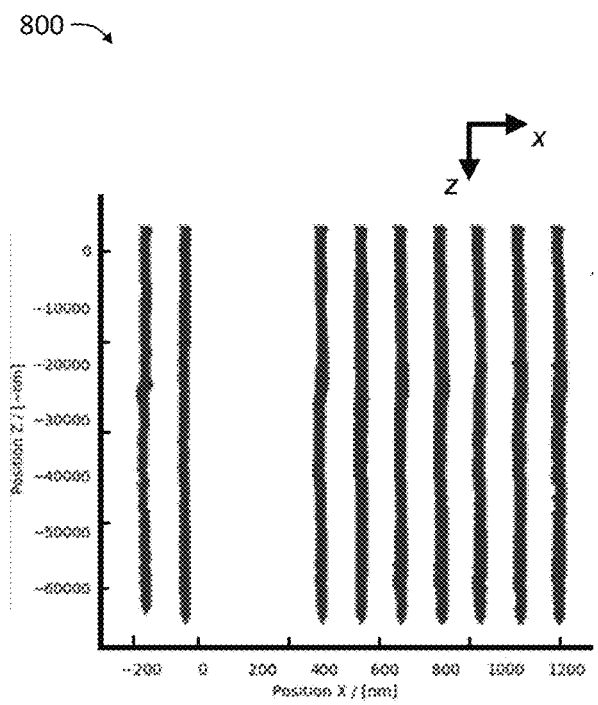
Figure 9:
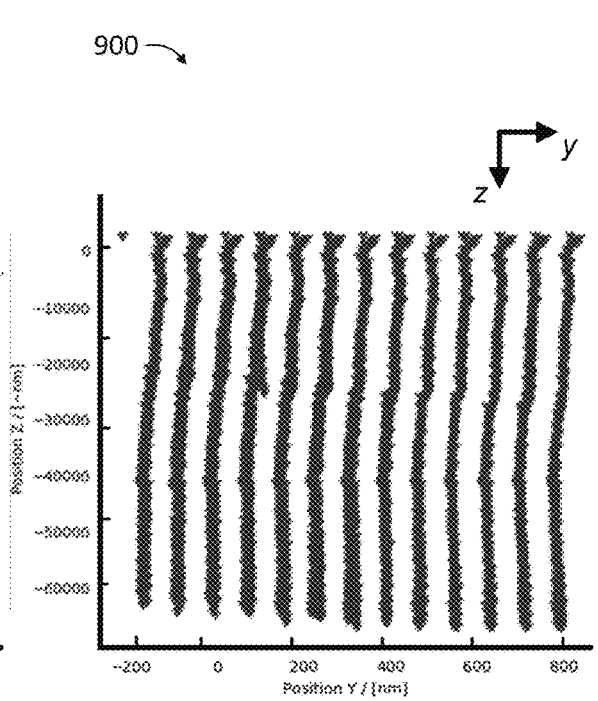

FIGS. 8-11 are graphs that visually represent the structural variation of a plurality of structures in a sample using a 3D fiducial, according to the present disclosure. FIGS. 8-11 show the types of information that can be obtained via the positional relationships determined using a 3D fiducial, greatly improving the accuracy of structural and fabrication processing analysis that can be performed compared to current techniques. For example, FIGS. 8 and 9 are graphs depicting the relative position of a plurality of structures at different depths from the sample surface as determined using methods and systems of the present disclosure in an x dimension 800 and y dimension 900, respectively. More specifically, FIGS. 6 and 7 are graphs depicting the relative position of a plurality of channel sat different depths from the surface of a 3D NAND wafer. FIG. 8 shows that there is very little variation of the structures in the x direction as the depth of the channels increase. This is likely indicated of very good performance of the fabrication tool used to create the channels in the x dimension. FIG. 9 shows that there was a collective shift in the negative y direction in the top half of the plurality of channels, and that the bottom half of the channels substantially maintained their y position. FIG. 9 also indicates that this drift in the upper half is more exaggerated in the leftmost channels. This may be indicative on an event occurring halfway through production of the channels that caused the fabrication tool to create a y dimensional drift.

Figure 10:
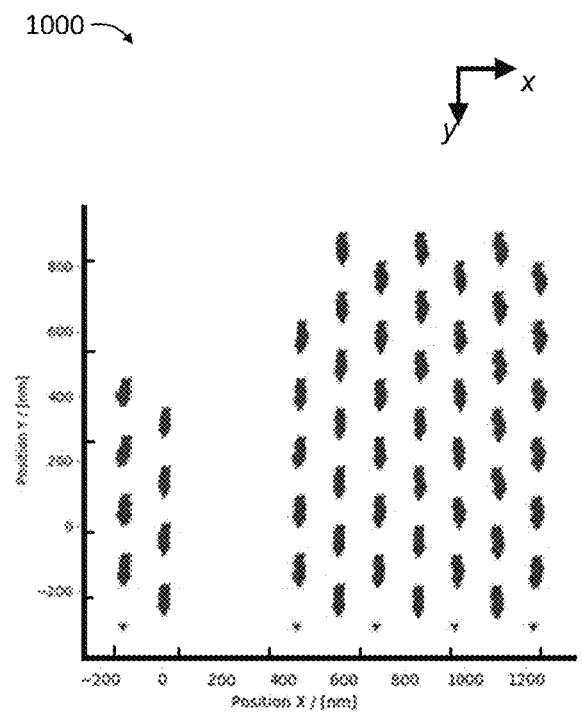
Figure 11:
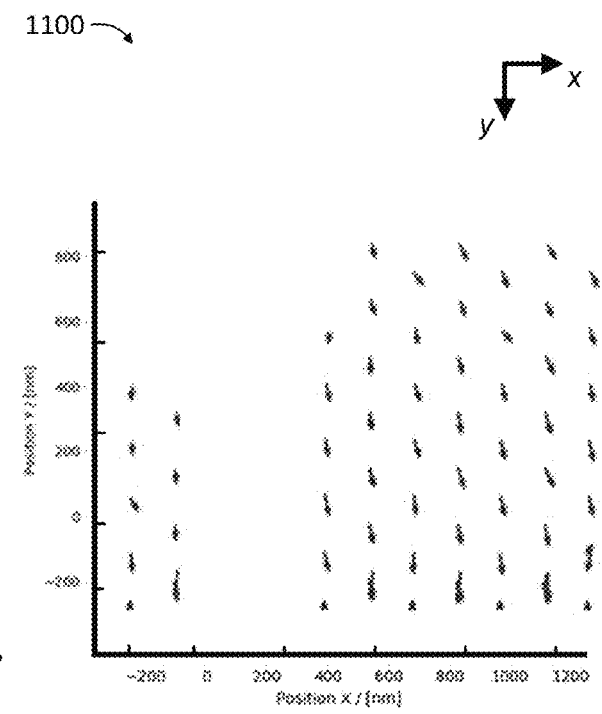

FIG. 10 is a graph 1000 that depicts the positions of the plurality channels in the x/y plane across the total depth (z direction) of the wafer (i.e., a top down view). Similarly, FIG. 11 is a graph 1100 that depicts the net shift in the x/y plane of each channel between the top of the channel and the bottom of the channel.

Figure 12:
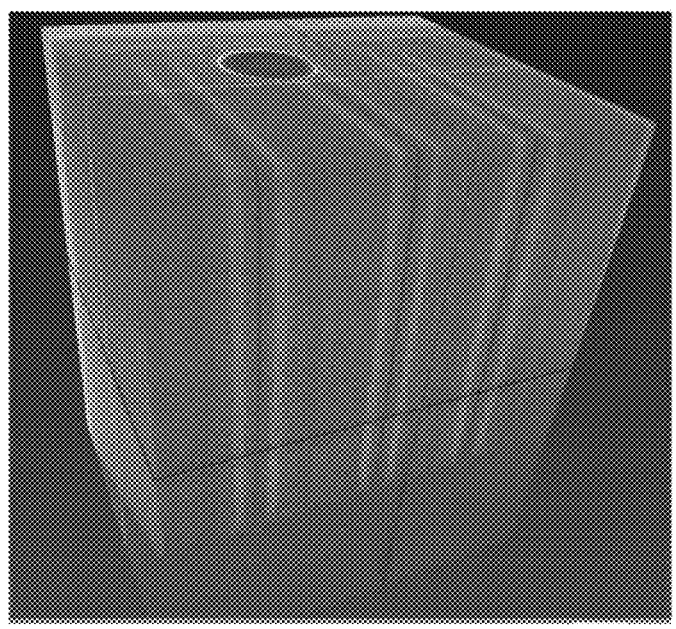
FIGS. 12 and 13 are 3D reconstructions generated using the positional relationships of structures within different images determined according to the present disclosure.
Figure 13:
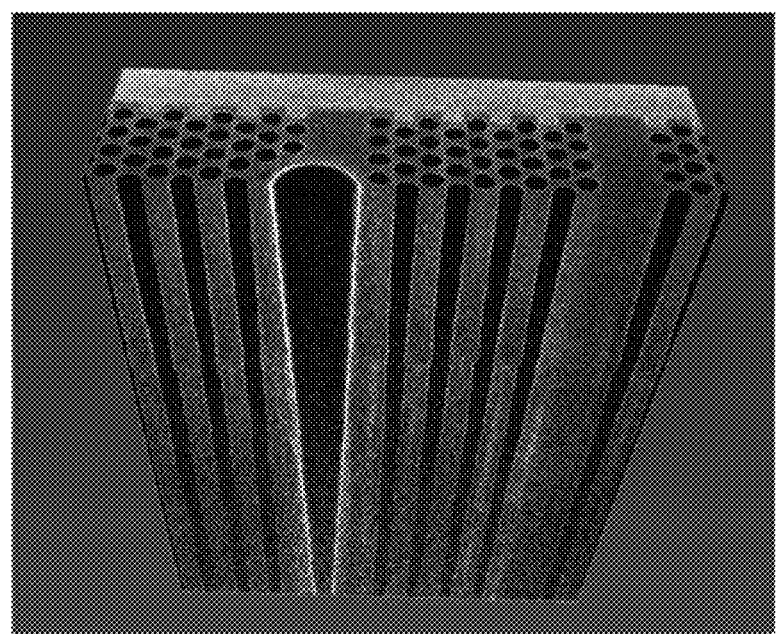

FIGS. 12-13 are 3D reconstructions generated using the positional relationships of structures within different images determined according to the present disclosure. FIG. 12 is a 3D reconstruction 1200 of a sample with the cross-section of the 3D fiducial visible on the top surface. FIG. 13 is a 3D reconstruction 1300 of a 3D NAND wafer with a cross-sectional planar view that bisects the 3D fiducial and a plurality of channels in the x/z plane.

Figure 14:
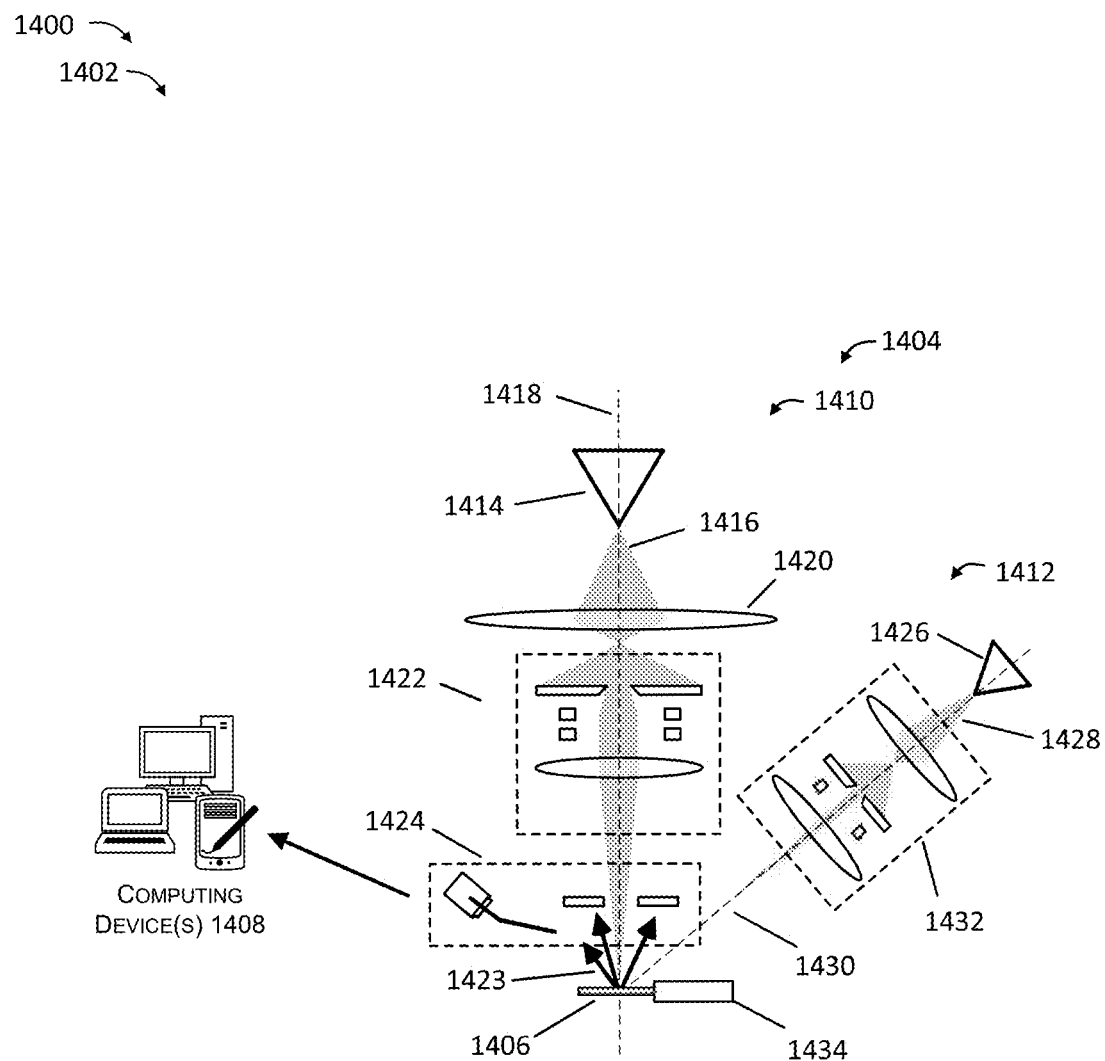
FIG. 14 depicts an environment using a 3D fiducial to generate high-precision positional relationships for structures within a sample.

FIG. 14 is an illustration of an environment 1400 for using a 3D fiducial to generate high-precision positional relationships for structures within a sample. Specifically, FIG. 14 shows an example environment 1402 that includes an example microscope system(s) 1404 for generating slice and view images of a sample 1406 and one or more computing devices 1408 for using, training, optimizing, and/or retraining depth blur reducing algorithms for generating high resolution reconstructions of 3D samples imaged with reduced z-dimensional blur. It is noted that present disclosure is not limited to environments that include microscopes, and that in some embodiments the environments 1400 may include a different type of system that is configured to generate correlated images, or may not include a system for generating images at all (e.g., a system comprising computing device(s) 1408 alone).

The example microscope system(s) 1404 may be or include one or more different types of optical, and/or charged particle microscopes, such as, but not limited to, a scanning electron microscope (SEM), a scanning transmission electron microscope (STEM), a transmission electron microscope (TEM), a charged particle microscope (CPM), a cryo-compatible microscope, focused ion beam (FIB) microscope, dual beam microscopy system, or combinations thereof. FIG. 14 shows the example microscope system(s) 1404 as being a dual beam microscopy system including a SEM column 1410 and a FIB column 1412.

FIG. 14 depicts the example microscope system(s) 1404 as including SEM column 1410 for imaging layers of the sample 1406 during slice and view imaging. The SEM column 1410 includes an electron source 1414 (e.g., a thermal electron source, Schottky-emission source, field emission source, etc.) that emits an electron beam 1416 along an electron emission axis 1418 and towards the sample 1406. The electron emission axis 1418 is a central axis that runs along the length of the example microscope system(s) 1404 from the electron source 1414 and through the sample 1406. While FIG. 14 depicts the example microscope system(s) 1404 as including an electron source 1404, in other embodiments the example microscope system(s) 1404 may comprise a charged particle source, such as an ion source, configured to emit a plurality of charged particles toward the sample 1406.

An accelerator lens 1420 accelerates/decelerates, focuses, and/or directs the electron beam 1416 towards an electron focusing column 1422. The electron focusing column 1422 focuses the electron beam 1412 so that it is incident on at least a portion of the sample 1406. Additionally, the focusing column 1422 may correct and/or tune aberrations (e.g., geometric aberrations, chromatic aberrations) of the electron beam 1416. In some embodiments, the electron focusing column 1422 may include one or more of an aperture, deflectors, transfer lenses, scan coils, condenser lenses, objective lens, etc. that together focus electrons from electron source 1414 onto a small spot on the sample 1406. Different locations of the sample 1406 may be scanned by adjusting the electron beam direction via the deflectors and/or scan coils. In this way, the electron beam 1416 acts as an imaging beam that is scanned across a surface layer of the sample (i.e., the surface of the layer proximate the SEM column 1404 and/or that is irradiated by the electron beam 1416). This irradiation of the surface layer of the sample 1406 causes the component electrons of the electron beam 1416 to interact with component elements/molecules/features of the sample, such that component elements/molecules/features cause emissions 1423 to be emitted by the sample 1406. The specific emissions that are released are based on the corresponding elements/molecules/features that caused them to be emitted, such that the emissions can be analyzed to determine information about the corresponding elements/molecules.

While the electron beam 1416 is incident on the surface layer of the sample 1406 a portion of its component electrons penetrate the sample and interact with elements/molecules/features at different depths from the surface of the sample. An electron interaction depth of the electron beam 1416 corresponds to the distance from the surface of the sample that includes 95% elements/molecules/features of the sample that electrons of the electron beam 1416 interact with during the irradiation. In this way, the emissions 1423 can be analyzed to determine information about elements/molecules that are present from the surface of the sample 1406 to the electron interaction depth.

FIG. 14 further illustrates a detector system 1424 for detecting emissions resultant from the electron beam 1416 being incident on the sample 1406. The detector system 1424 may comprise one or more detectors positioned or otherwise configured to detect such emissions. In various embodiments, different detectors and/or different portions of single detectors may be configured to detect different types of emissions, or be configured such that different parameters of the emissions detected by the different detectors and/or different portions. The detector system 1424 is further configured to generate a data/data signal corresponding to the detected emissions, and transmit the data/data signal to one or more computing devices 1408.

While FIG. 14 depicts the example microscope system(s) 1404 as including FIB column 1412 for removing layers of the sample 1406 during slice and view imaging, in other embodiments the example microscope system(s) 1404 may include other types of delayering components, such as a laser, a mechanical blade (e.g., a diamond blade), an electron beam, etc. The FIB column 1412 is shown as including a charged particle emitter 1426 configured to emit a plurality of ions 1428 along an ion emission axis 1430.

The ion emission axis 1430 is a central axis that runs from the charged particle emitter 1426 and through the sample 1406. The FIB column 1412 further includes an ion focusing column 1432 that comprises one or more of an aperture, deflectors, transfer lenses, scan coils, condenser lenses, objective lens, etc. that together focus ions from charged particle emitter 1426 onto a small spot on the sample 1406. In this way, the elements in the ion focusing column 1432 may cause the ions emitted by the charged particle emitter 1426 to mill away or otherwise remove one or more portions of the sample. For example, during slice and view imaging the FIB column 1412 may be configured to cause a surface layer of the sample 1406 having a known thickness to be removed from the sample 1406 between image acquisitions.

FIG. 14 further illustrates the example microscope system(s) 1404 as further including a sample holder 1434. The sample holder 1434 is configured to hold the sample 1406, and can translate, rotate, and/or tilt the sample 1402 in relation to the example microscope system(s) 1404.

The environment 1400 is also shown as including one or more computing device(s) 1408. Those skilled in the art will appreciate that the computing devices 1408 depicted in FIG. 14 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 1408 may also be connected to other devices that are not illustrated, or instead may operate as a stand-alone system.

It is also noted that one or more of the computing device(s) 1408 may be a component of the example microscope system(s) 1404, may be a separate device from the example microscope system(s) 1404 which is in communication with the example microscope system(s) 1404 via a network communication interface, or a combination thereof. For example, an example microscope system(s) 1404 may include a first computing device 1408 that is a component portion of the example microscope system(s) 1404, and which acts as a controller that drives the operation of the example charged particle microscope system(s) 1404 (e.g., adjust the scanning location on the sample by operating the scan coils, etc.). In such an embodiment the example microscope system(s) 1404 may also include a second computing device 1408 that is desktop computer separate from the example microscope system(s) 1404, and which is executable to process data received from the detector system 1424 to generate images of the sample 1406 and/or perform other types of analysis or post processing of detector data. The computing devices 1408 may further be configured to receive user selections via a keyboard, mouse, touchpad, touchscreen, etc.

The computing device(s) 1408 are configured to generate images of the surface layer of the sample 1406 within the example microscope system(s) 1404 based on data and/or the data signal from the detector system 1424. Specifically, because the data and/or the data signal from the detector system 1424 is based on the emissions 1423 emitted from the sample 1406 during irradiation of the surface of the sample, the data and/or the data signal can be analyzed to determine the makeup of the sample (i.e., component elements/molecules/features) between the surface of the sample and the electron interaction depth of the electron beam 1416 such that an image of the surface layer of the sample can be generated. In some embodiments, the images are grayscale images that show contrasts indicative of the shape and/or the materials of the sample.

Moreover, since the FIB column 1412 is able to remove a layer of the sample 1406 having a known thickness, the computing device(s) 1408 are able to determine the location of the sample 1406 to which each image of the series of images corresponds. In this way, during the process of slice and view imaging, the computing device(s) 1408 generate a series of images of layers of the sample at periodic depths.

According to the present invention, the SEM column 1410 or the FIB column 1412 may be further configured to generate a 3D fiducial in the sample 1406. The 3D fiducial is a fiducial having a shape such that when a layer of material having a uniform thickness is removed from the region of interest, the cross-sectional shape of the 3D fiducial in the revealed surface is consistent. The 3D fiducial may have a depth along a central axis (e.g., z-axis) that is greater than or equal to the depth of the region of interest being evaluated. The 3D fiducial may be a void having a substantially prismatic shape. In some embodiments, the 3D fiducial may be created by milling with a the FIB column 1412. In alternative embodiments, the 3D fiducial may be created by performing a spot burn into the sample with the electron beam 1416 of the SEM column 1410 to such a depth that a cross-section of the 3D fiducial will be present in a set of slice and view images of the region of interest. Alternatively, the 3D fiducial may be a reference structure having a substantially prismatic shape that is generated by depositing a material into a void that has been tooled into the sample.

The computing device 1408 are configured to access one or more slice and view images of sample 1406 that include the 3D fiducial. The slice and view images may be obtained by a computing device by a wired or wireless connection (e.g., a WAN, a LAN, a cable hookup, etc.), or from another memory device storing the training data (e.g., another computer memory, a local memory, a hard drive, a CD-ROM, a portable memory device, etc.).

The computing device(s) 1408 are then configured to determine positions of the 3D fiducial and one or more structures in the slice and view images. Identifying the position of the 3D fiducial and/or structures in the images may correspond to determining the center of the, a center of mass, an average position, a position further from an edge. The locations and/or centers may be identified by user inputs, pattern recognition algorithms, image recognition algorithms, or a combination thereof. For example, the computing device(s) 1408 may apply pattern recognition algorithm to identify the 3D fiducial within the image, and a cylindrical fit algorithm to locate the center point of the 3D fiducial.

The computing device(s) 1408 then determine a relative position between the position of the 3D fiducial and individual structures within individual slice and view images. Determining the relative position may comprise determining one of a vector, a translation, a distance, and/or a coordinate difference between the position of the 3D fiducial in the image and the position of the structure in the image. In some embodiments, determining the relative position also includes scaling the image according to the 3D fiducial as depicted in the image. Because the cross-section of the 3D fiducial is consistent across the multiple surfaces imaged via slice and view imaging, there is an expected size of the 3D fiducial across the slice and view images. Thus, individual images may be scaled so that the cross-section of the 3D fiducial matches the expected size, thus ensuring that the slice and view images are of a common scale.

According to the present invention the computing device(s) 1408 are further programed to determine positional relationships between structures as depicted in different slice and view images within a common reference frame. Because the cross-section of the 3D fiducial is substantially uniform along its central axis (e.g., z-axis), and because the orientation of this central axis is known, the computing device(s) 1408 can use the depths of each image to orient/align the images in a common reference frame (i.e., determine the global geometric relationship between each of the images). In this way, computing device(s) 1408 according to the present disclosure are able to use the depth associated with each slice and view image and the known orientation of the central axis to place the positions of the 3D fiducials within each image in a common reference frame. Once the images are positioned and/or oriented within this common reference frame, the computing device(s) 1408 may determine positional relationships between structures in different images.

As discussed above, the computing devices 1408 include one or more processors configured to execute instructions, applications, or programs stored in a memory(s) accessible to the one or more processors. In some examples, the one or more processors may include hardware processors that include, without limitation, a hardware central processing unit (CPU), a graphics processing unit (GPU), and so on. While in many instances the techniques are described herein as being performed by the one or more processors, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories accessible to the one or more processors are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between such a memory and other storage devices for purposes of memory management and data integrity. Alternatively, in other implementations, some or all the software components may execute in memory on another device and communicate with the computing devices 1408. Some or all of the system components or data structures may also be stored (e.g., as instructions or structured data) on anon-transitory, computer accessible medium or a portable article to be read by an appropriate drive, various examples of which are described above. In some implementations, instructions stored on a computer-accessible medium separate from the computing devices 1408 may be transmitted to the computing devices 1408 via transmission media or signals such as electrical, electromagnetic, or digital signals, conveyed via a communication medium such as a wireless link. Various implementations may further include receiving, sending, or storing instructions and/or data implemented in accordance with the foregoing description upon a computer-accessible medium.

Examples of inventive subject matter according to the present disclosure are described in the following enumerated paragraphs.

A1. A method for evaluating structures in a sample with a charged particle microscope system, the method comprising: milling a 3D fiducial in the sample; milling a first portion of the sample to expose a first surface, the first surface including the 3D fiducial; imaging at least a portion of the first surface, wherein the portion of the first surface includes the 3D fiducial and a first cross-section of a structure; milling a second portion of the sample to expose a second surface, the second surface including the 3D fiducial; imaging at least a portion of the second surface, wherein the portion of the second surface includes the 3D fiducial and a second cross-section of the structure; determining, based on the first image, a first relative position between the 3D fiducial in the first image and the first cross-section of the structure; determining, based on the second image, a second relative position between the 3D fiducial in the second image and the second cross-section of the structure; and determining, based on the first relative position and the second relative position, a positional relationship between the first cross-section of the structure and the second cross-section of the structure.

A2. The method of paragraph A1, wherein the 3D fiducial is configured such that when a layer of material having a uniform thickness is removed from a surface of the sample that includes the 3D fiducial, the cross-sectional shape of the 3D fiducial in the new surface is consistent.

A2.1. The method of paragraph A2, wherein the 3D fiducial is a milled void having the shape of a prism.

A2.1.1. The method of paragraphs A2.1, wherein the prism is an oblique prism.

A2.1.2. The method of paragraphs A2.1, wherein the prism is a right prism.

A2.1.3. The method of any paragraphs A2.1-A2.1.2, wherein the 3D fiducial is a milled void having the shape of a cylinder.

A2.1.4. The method of any paragraphs A2.1 and A2.1.2-A2.1.3, wherein the height of the prism is perpendicular to the surface of the sample.

A2.1.5. The method of any paragraphs A2.1-A2.1.4, wherein the 3D fiducial has a consistent size shape and position along a z axis.

A2.2. The method of any paragraphs A2.1-A2.1.5, wherein the 3D fiducial is a spot burn creating a void in the sample.

A2.3. The method of any paragraphs A2-A2.2, wherein the 3D fiducial is a void in the sample having a depth that is greater than a depth of a region of the sample being evaluated by the charged particle microscope system.

A2.4. The method of any paragraphs A2-A2.3, wherein the location of the 3D fiducial is in a consistent position along the z-axis.

A2.4.1. The method of paragraph A2.4, wherein the position of the center of a cross-section of the 3D fiducial is constant along the z-axis.

A2.4.2. The method of any of paragraphs A2.4-A2.4.1, wherein the cross-section of the 3D fiducial decreases in size along the z axis.

A2.5. The method of any paragraphs A2-A2.4.2, wherein the 3D fiducial has a circular cross-section.

A2.6. The method of any paragraphs A2-A2.5, wherein the 3D fiducial has an ovoid cross-section A2.7. The method of any paragraphs A2-A2.6, wherein the 3D fiducial is normal to the surface of the sample.

A2.8. The method of any paragraphs A2-A2.7, wherein the 3D fiducial is parallel to the imaging axis of the charged particle microscope system.

A3. The method of any of paragraphs A1-A2.8, wherein determining the first relative position comprises: determining a reference position of the 3D fiducial in the first image; determining a first feature position of the first cross-section of the structure in the first image; and wherein the first relative position corresponds to the difference between the reference position and the first feature position.

A3.1. The method of paragraph A3, wherein the first relative position is one of a vector, a translation, a distance, and/or a coordinate difference within the plane of the first surface depicted in the first image.

A3.2. The method of any of paragraphs A1-A3.1, wherein determining the first relative position comprises determining a scale of the first relative position based on one or more of a magnification of the first image and a physical feature of the cross-section of the 3D fiducial in the first image.

A3.3. The method of any of paragraphs A1-A3.2, wherein determining the second relative position comprises: determining a reference position of the 3D fiducial in the second image; determining a second feature position of the second cross-section of the structure in the second image; and wherein the second relative position corresponds to the difference between the reference position and the second feature position.

A3.3.1. The method of paragraph A3.3, wherein the second relative position is one of a vector, a translation, a distance, and/or a coordinate difference within the plane of the second surface depicted in the second image.

A3.3.2. The method of any of paragraphs A1-A3.3.1, wherein determining the second relative position comprises determining a scale of the second relative position based on one or more of a magnification of the second image and a physical feature of the cross-section of the 3D fiducial in the second image.

A4. The method of any of paragraphs A1-A3.3.2, wherein determining the positional relationship between the first cross-section of the structure and the second cross-section of the structure comprises: determining a global geometric relationship between the 3D fiducial as depicted in the first image and the global geometric relationship between the 3D fiducial as depicted in the second image; and determining the positional relationship between the first cross-section of the structure and the second cross-section of the structure based on the first relative position, the second relative position, and the global geometric relationship.

A4.1. The method of paragraph A4, wherein determining the global geometric relationship comprises: determining the depth of the first surface; and determining, based on the depth of the first surface, an expected location of the cross-section of the 3D fiducial in the first surface.

A4.2. The method of any of paragraphs A4-A4.1, wherein determining the global geometric relationship comprises: determining the depth of the second surface; and determining, based on the depth of the second surface, an expected location of the cross-section of the 3D fiducial in the second surface.

A4.3. The method of any of paragraphs A4-A4.2, wherein determining the global geometric relationship comprises: determining a difference between the depth of the first surface and the depth of the second surface; and determining the expected difference in position between the location of the cross-section of the 3D fiducial in the first surface and the location of the cross-section of the 3D fiducial in the second surface.

A4.3.1. The method of paragraph A4.3, wherein the expected difference in position between the location of the cross-section of the 3D fiducial in the first surface and the location of the cross-section of the 3D fiducial in the second surface comprises determining an expected translation of the 3D fiducial.

A4.3.1.1. The method of paragraph A4.3.1, wherein determining the expected translation of the 3D fiducial comprises at least one of: determining a difference between the central axis of the 3D fiducial and the imaging axis of the charged particle system; and determining a consistent shift in determined positional relationships of structures within the sample, and attributing the consistent shift to a difference between the central axis of the 3D fiducial and the imaging axis of the charged particle system.

A4.4. The method of any of paragraphs A4-A4.3.1.1, wherein determining the depth of the first surface and/or the second surface is based on one or more of: the size of the cross-section of the 3D fiducial in the surface; a number of layers removed from the sample; the thickness of layers removed from the sample; the height of the sample being evaluated; the number of slice and view images of the sample obtained; and the distance between a first 3D fiducial and a second 3D fiducial.

A5. The method of any of paragraphs A1-A4.4, wherein the first image further depicts a third cross-section of an additional structure, the second image further depicts a fourth cross-section of the additional structure.

A5.1. The method of paragraph A5, further comprising: determining, based on the first image, a third relative position between the 3D fiducial in the first image and the second cross-section of the additional structure; determining, based on the second image, a fourth relative position between the 3D fiducial in the second image and the fourth cross-section of the additional structure; and determining, based on the third relative position and the fourth relative position, a positional relationship between the third cross-section of the additional structure and the fourth cross-section of the additional structure.

A5.1.1. The method of paragraph A5.1, further comprising repeating the steps described in paragraph A5.1 to determine positional relationships for one or more further structures.

A6. The method of any of paragraphs A1-A5.1.1, further comprising: milling a third portion of the sample to expose a third surface, the third surface including the 3D fiducial; and imaging at least a portion of the third surface, wherein the portion of the third surface includes the 3D fiducial.

A6.1. The method of paragraph A6, wherein the portion of the third surface further includes a third cross-section of the structure.

A6.1.1. The method of paragraph A6.1, further comprising: determining, based on the third image, a third relative position between the 3D fiducial in the third image and the third cross-section of the structure; and determining, based on the third relative position and at least one of the first relative position and the second relative position, an additional positional relationship between at least one of the first cross-section of the structure and the second cross-section of the structure.

A6.2. The method of any of paragraphs A6-A6.1, further comprising obtaining a plurality of additional images of layers of the sample using slice and view imaging, wherein each of the plurality of additional images depicts a cross-section of the 3D fiducial.

A6.2.1. The method of paragraph A6.2, further comprising determining additional positional relationships for a plurality of additional structures in the sample based on the plurality of additional images.

A7. The method of any of paragraphs A1-A6.2.1, further comprising generating a reconstruction of the structure based at least in part on the positional relationship.

A7.1. The method of paragraph A7, further comprising generating a reconstruction of the sample based at least in part on the positional relationship.

A8. The method of any of paragraphs A1-A6.2.1, further comprising determining a variation of the position of structures in the sample from an expected position based at least in part on the positional relationship.

A9. The method of any of paragraphs A1-A8, further comprising determining a drift of the structure perpendicular to the imaging axis based at least in part on the positional relationship.

A10. The method of any of paragraphs A1-A9, wherein the cross-sections of the 3D fiducial in each image is an absolute reference position across the plurality of surfaces imaged, as the location of the cross-section of the 3D fiducial in each plane perpendicular to the imagining access at each depth can be determined.

A10.1. The method of paragraph A10, where the location of the cross-section of the 3D fiducial in each plane perpendicular to the imagining access at each depth is the same.

A10.2. The method of paragraph A10, where the location of the cross-section of the 3D fiducial in each plane perpendicular to the imagining access at each depth is determined based at least in part on the depth and an angle between a central axis of the 3D fiducial and the imaging axis.

A11. The method of any of paragraphs A1-A10.2, further comprising scaling at least one of the first image and the second image based on the cross-section of the 3D fiducial in the corresponding image.

A12. The method of any of A1-A11, further comprising generating a 3D reconstruction of the sample based at least in part on the positional relationship between the first cross-section of the structure and the second cross-section of the structure.

A13. The method of any of paragraphs A1-A12, wherein the sample is one of: a biological sample; a lamella; a wafer; a semiconductor chip; and a memory chip.

A13.1. The method of paragraph A13, wherein the sample is a 3DNAND memory structure, and the structure is a channel.

A13.1.1. The method of paragraph A13.1, further comprising determining a drift of the channel based at least in part on the positional relationship.

A13.1.2. The method of any of paragraphs A13.1-A13.1.1, further comprising evaluating a production of the channel based at least in part on the positional relationship.

A13.1.3. The method of any of paragraphs A13.1-A13.1.2, further comprising repeating the method for a plurality of channels within the memory structure.

A13.1.4. The method of any of paragraphs A13.1-A13.1.2, wherein the process is used to simultaneously identify the positional relationship for a plurality of channels within the memory structure.

A13.1.5. The method of any of paragraphs A13.1-A13.1.4, wherein the sample comprises at least a first stack of channels and a second stack of channels, where the second stack of channels is arranged below the first stack, and the method further comprises determining an offset between a channel in the first stack and a corresponding channel in the second stack.

A13.1.6. The method of any of paragraphs A13.1-A13.1.5, wherein the channels at between 100 nm and 150 nm in diameter.

A14. The method of any of paragraphs A1-A13.1.6, further comprising determining the position of the cross-section of the 3D fiducial in the first image, the cross-section of the 3D fiducial in the second image, the first cross-section of the structure in the first image, and the second cross-section of the structure in the second image.

A14.1. The method of paragraph A14, wherein at least one of the cross-section of the 3D fiducial in the first image, the cross-section of the 3D fiducial in the second image, the first cross-section of the structure in the first image, and the second cross-section of the structure in the second image are determined using a cylinder fit.

A14.2. The method of paragraph A14, wherein at least one of the cross-section of the 3D fiducial in the first image, the cross-section of the 3D fiducial in the second image, the first cross-section of the structure in the first image, and the second cross-section of the structure in the second image are determined using an image recognition algorithm.

A14.3. The method of paragraph A14, wherein at least one of the cross-section of the 3D fiducial in the first image, the cross-section of the 3D fiducial in the second image, the first cross-section of the structure in the first image, and the second cross-section of the structure in the second image are determined using an expected distance of the structure in the image to the 3D fiducial.

A15. The method of any of paragraphs A1-A14.3, further comprising identifying that the first cross-section of the structure and the second cross-section of the structure are part of the sample structure using a pattern recognition algorithm.

A16. The method of any of paragraphs A1-A15, wherein the imaging is performed using an electron beam.

A17. The method of any of paragraphs A1-A16, wherein the milling is performed using a focused ion beam.

A18. The method of any of paragraphs A1-A17, wherein milling the second layer comprises milling a consistent thickness of the sample such that the second surface is parallel to the first surface.

A18.1. The method of paragraph A18, wherein the milling the second layer comprises milling along the imaging axis.

A18.2. The method of any of paragraphs A18-A18.1, wherein the milling the second layer comprises performing a diagonal mill of the sample.

A18.2.1. The method of paragraph A18.2, where performing the diagonal mill of the sample comprises: milling a void in the sample proximate to the region of the sample that is being evaluated; depositing a cap material on a wall of the void proximate to the region of the sample that is being evaluated; and wherein milling the first portion of the sample to expose the first surface is initiated by milling a portion of the cap material.

A19. The method of any paragraphs A1-A2.8, wherein the 3D fiducial is milled and/or burned into the sample to such a depth that a cross-section of the 3D fiducial is present in a plurality of images of the sample obtained via slice and view imaging.

A20. The method of any of paragraphs A1-A19, wherein the method further comprises milling a reference fiducial on a surface of the sample that is not removed during slice and view imaging.

B1. A method for generating precise structure reconstruction using slice and view images, the method comprising: obtaining a first slice and view image of a first surface of the sample, wherein the first image depicts a 3D fiducial and a first cross-section of a structure in the sample; obtaining a second slice and view image of a second surface of the sample, wherein the second image depicts the 3D fiducial and a second cross-section of the structure; determining, based on the first image, a first relative position between the 3D fiducial in the first image and the first cross-section of the structure; determining, based on the second image, a second relative position between the 3D fiducial in the second image and the second cross-section of the structure; and determining, based on the first relative position and the second relative position, a positional relationship between the first cross-section of the structure and the second cross-section of the structure.

B1.1. The method of paragraph B1, wherein obtaining the first image and the second image comprises: milling a first portion of the sample to expose the first surface, the first surface including the 3D fiducial; imaging at least a portion of the first surface to obtain the first image; milling a second portion of the sample to expose the second surface, the second surface including the 3D fiducial; and imaging at least a portion of the second surface to obtain the second image.

B1.2. The method of paragraph B1, wherein obtaining the first image and the second image comprises accessing the first image and the second image via an accessible memory, a network connection, or a combination thereof.

B2. The method of any of paragraphs B1-B1.2, wherein the 3D fiducial is configured such that when a layer of material having a uniform thickness is removed from a surface of the sample that includes the 3D fiducial, the cross-sectional shape of the 3D fiducial in the new surface is consistent.

B2.1. The method of paragraph B2, wherein the 3D fiducial is a milled void having the shape of a prism.

B2.1.1. The method of paragraphs B2.1, wherein the prism is an oblique prism.

B2.1.2. The method of paragraphs B2.1, wherein the prism is a right prism.

B2.1.3. The method of any paragraphs B2.1-B2.1.2, wherein the 3D fiducial is a milled void having the shape of a cylinder.

B2.1.4. The method of any paragraphs B2.1 and B2.1.2-B2.1.3, wherein the height of the prism is perpendicular to the surface of the sample.

B2.1.5. The method of any paragraphs B2.1-B2.1.4, wherein the 3D fiducial has a consistent size shape and position along a z axis.

B2.2. The method of any paragraphs B2.1-B2.1.5, wherein the 3D fiducial is a spot burn creating a void in the sample.

B2.3. The method of any paragraphs B2-B2.2, wherein the 3D fiducial is a void in the sample having a depth that is greater than a depth of a region of the sample being evaluated by the charged particle microscope system.

B2.4. The method of any paragraphs B2-B2.3, wherein the location of the 3D fiducial is in a consistent position along the z-axis.

B2.4.1. The method of paragraph B2.4, wherein the position of the center of a cross-section of the 3D fiducial is constant along the z-axis.

B2.4.2. The method of any of paragraphs B2.4-B2.4.1, wherein the cross-section of the 3D fiducial decreases in size along the z axis.

B2.5. The method of any paragraphs B2-B2.4.2, wherein the 3D fiducial has a circular cross-section.

B2.6. The method of any paragraphs B2-B2.5, wherein the 3D fiducial has an ovoid cross-section B2.7. The method of any paragraphs B2-B2.6, wherein the 3D fiducial is normal to the surface of the sample.

B2.8. The method of any paragraphs B2-B2.7, wherein the 3D fiducial is parallel to the imaging axis of the charged particle microscope system.

B3. The method of any of paragraphs B1-B2.8, wherein determining the first relative position comprises: determining a reference position of the 3D fiducial in the first image; determining a first feature position of the first cross-section of the structure in the first image; and wherein the first relative position corresponds to the difference between the reference position and the first feature position.

B3.1. The method of paragraph B3, wherein the first relative position is one of a vector, a translation, a distance, and/or a coordinate difference within the plane of the first surface depicted in the first image.

B3.2. The method of any of paragraphs B1-B3.1, wherein determining the first relative position comprises determining a scale of the first relative position based on one or more of a magnification of the first image and a physical feature of the cross-section of the 3D fiducial in the first image.

B3.3. The method of any of paragraphs B1-B3.2, wherein determining the second relative position comprises: determining a reference position of the 3D fiducial in the second image; determining a second feature position of the second cross-section of the structure in the second image; and wherein the second relative position corresponds to the difference between the reference position and the second feature position.

B3.3.1. The method of paragraph B3.3, wherein the second relative position is one of a vector, a translation, a distance, and/or a coordinate difference within the plane of the second surface depicted in the second image.

B3.3.2. The method of any of paragraphs B1-B3.3.1, wherein determining the second relative position comprises determining a scale of the second relative position based on one or more of a magnification of the second image and a physical feature of the cross-section of the 3D fiducial in the second image.

B4. The method of any of paragraphs B1-B3.3.2, wherein determining the positional relationship between the first cross-section of the structure and the second cross-section of the structure comprises: determining a global geometric relationship between the 3D fiducial as depicted in the first image and the global geometric relationship between the 3D fiducial as depicted in the second image; and determining the positional relationship between the first cross-section of the structure and the second cross-section of the structure based on the first relative position, the second relative position, and the global geometric relationship.

B4.1. The method of paragraph B4, wherein determining the global geometric relationship comprises: determining the depth of the first surface; and determining, based on the depth of the first surface, an expected location of the cross-section of the 3D fiducial in the first surface.

B4.2. The method of any of paragraphs B4-B4.1, wherein determining the global geometric relationship comprises: determining the depth of the second surface; and determining, based on the depth of the second surface, an expected location of the cross-section of the 3D fiducial in the second surface.

B4.3. The method of any of paragraphs B4-B4.2, wherein determining the global geometric relationship comprises: determining a difference between the depth of the first surface and the depth of the second surface; and determining the expected difference in position between the location of the cross-section of the 3D fiducial in the first surface and the location of the cross-section of the 3D fiducial in the second surface.

B4.3.1. The method of paragraph B4.3, wherein the expected difference in position between the location of the cross-section of the 3D fiducial in the first surface and the location of the cross-section of the 3D fiducial in the second surface comprises determining an expected translation of the 3D fiducial.

B4.3.1.1. The method of paragraph B4.3.1, wherein determining the expected translation of the 3D fiducial comprises at least one of: determining a difference between the central axis of the 3D fiducial and the imaging axis of the charged particle system; and determining a consistent shift in determined positional relationships of structures within the sample, and attributing the consistent shift to a difference between the central axis of the 3D fiducial and the imaging axis of the charged particle system.

B4.4. The method of any of paragraphs B4-B4.3.1.1, wherein determining the depth of the first surface and/or the second surface is based on one or more of: the size of the cross-section of the 3D fiducial in the surface; a number of layers removed from the sample; the thickness of layers removed from the sample; the height of the sample being evaluated; the number of slice and view images of the sample obtained; and the distance between a first 3D fiducial and a second 3D fiducial.

B5. The method of any of paragraphs A1-A4.4, wherein the first image further depicts a third cross-section of an additional structure, the second image further depicts a fourth cross-section of the additional structure.

B5.1. The method of paragraph B5, further comprising: determining, based on the first image, a third relative position between the 3D fiducial in the first image and the second cross-section of the additional structure; determining, based on the second image, a fourth relative position between the 3D fiducial in the second image and the fourth cross-section of the additional structure; and determining, based on the third relative position and the fourth relative position, a positional relationship between the third cross-section of the additional structure and the fourth cross-section of the additional structure.

B5.1.1. The method of paragraph B5.1, further comprising repeating the steps described in paragraph A5.1 to determine positional relationships for one or more further structures.

B6. The method of any of paragraphs B1-B5.1.1, further comprising: milling a third portion of the sample to expose a third surface, the third surface including the 3D fiducial; and imaging at least a portion of the third surface, wherein the portion of the third surface includes the 3D fiducial.

B6.1. The method of paragraph B6, wherein the portion of the third surface further includes a third cross-section of the structure.

B6.1.1. The method of paragraph B6.1, further comprising: determining, based on the third image, a third relative position between the 3D fiducial in the third image and the third cross-section of the structure; and determining, based on the third relative position and at least one of the first relative position and the second relative position, an additional positional relationship between at least one of the first cross-section of the structure and the second cross-section of the structure.

B6.2. The method of any of paragraphs B6-B6.1, further comprising obtaining a plurality of additional images of layers of the sample using slice and view imaging, wherein each of the plurality of additional images depicts a cross-section of the 3D fiducial.

B6.2.1. The method of paragraph B6.2, further comprising determining additional positional relationships for a plurality of additional structures in the sample based on the plurality of additional images.

B7. The method of any of paragraphs B1-B6.2.1, further comprising generating a reconstruction of the structure based at least in part on the positional relationship.

B7.1. The method of paragraph B7, further comprising generating a reconstruction of the sample based at least in part on the positional relationship.

B8. The method of any of paragraphs B1-B6.2.1, further comprising determining a variation of the position of structures in the sample from an expected position based at least in part on the positional relationship.

B9. The method of any of paragraphs B1-B8, further comprising determining a drift of the structure perpendicular to the imaging axis based at least in part on the positional relationship.

B10. The method of any of paragraphs B1-B9, wherein the cross-sections of the 3D fiducial in each image is an absolute reference position across the plurality of surfaces imaged, as the location of the cross-section of the 3D fiducial in each plane perpendicular to the imagining access at each depth can be determined.

B10.1. The method of paragraph B10, where the location of the cross-section of the 3D fiducial in each plane perpendicular to the imagining access at each depth is the same.

B10.2. The method of paragraph B10, where the location of the cross-section of the 3D fiducial in each plane perpendicular to the imagining access at each depth is determined based at least in part on the depth and an angle between a central axis of the 3D fiducial and the imaging axis.

B11. The method of any of paragraphs B1-B10.2, further comprising scaling at least one of the first image and the second image based on the cross-section of the 3D fiducial in the corresponding image.

B12. The method of any of B1-B11, further comprising generating a 3D reconstruction of the sample based at least in part on the positional relationship between the first cross-section of the structure and the second cross-section of the structure.

B13. The method of any of paragraphs B1-B12, wherein the sample is one of: a biological sample; a lamella; a wafer; a semiconductor chip; and a memory chip.

B13.1. The method of paragraph B13, wherein the sample is a 3DNAND memory structure, and the structure is a channel.

B13.1.1. The method of paragraph B13.1, further comprising determining a drift of the channel based at least in part on the positional relationship.

B13.1.2. The method of any of paragraphs B13.1-B13.1.1, further comprising evaluating a production of the channel based at least in part on the positional relationship.

B13.1.3. The method of any of paragraphs B13.1-B13.1.2, further comprising repeating the method for a plurality of channels within the memory structure.

B13.1.4. The method of any of paragraphs B13.1-B13.1.2, wherein the process is used to simultaneously identify the positional relationship for a plurality of channels within the memory structure.

B13.1.5. The method of any of paragraphs B13.1-B13.1.4, wherein the sample comprises at least a first stack of channels and a second stack of channels, where the second stack of channels is arranged below the first stack, and the method further comprises determining an offset between a channel in the first stack and a corresponding channel in the second stack.

B13.1.6. The method of any of paragraphs B13.1-B13.1.5, wherein the channels are between 100 nm and 150 nm in diameter.

B14. The method of any of paragraphs B1-B13.1.6, further comprising determining the position of the cross-section of the 3D fiducial in the first image, the cross-section of the 3D fiducial in the second image, the first cross-section of the structure in the first image, and the second cross-section of the structure in the second image.

B14.1. The method of paragraph B14, wherein at least one of the cross-section of the 3D fiducial in the first image, the cross-section of the 3D fiducial in the second image, the first cross-section of the structure in the first image, and the second cross-section of the structure in the second image are determined using a cylinder fit.

B14.2. The method of paragraph B14, wherein at least one of the cross-section of the 3D fiducial in the first image, the cross-section of the 3D fiducial in the second image, the first cross-section of the structure in the first image, and the second cross-section of the structure in the second image are determined using an image recognition algorithm.

B14.3. The method of paragraph B14, wherein at least one of the cross-section of the 3D fiducial in the first image, the cross-section of the 3D fiducial in the second image, the first cross-section of the structure in the first image, and the second cross-section of the structure in the second image are determined using an expected distance of the structure in the image to the 3D fiducial.

B15. The method of any of paragraphs B1-B14.3, further comprising identifying that the first cross-section of the structure and the second cross-section of the structure are part of the sample structure using a pattern recognition algorithm.

B16. The method of any of paragraphs B1-B15, wherein the imaging is performed using an electron beam.

B17. The method of any of paragraphs B1-B16, wherein the milling is performed using a focused ion beam.

B18. The method of any of paragraphs B1-B17, wherein milling the second layer comprises milling a consistent thickness of the sample such that the second surface is parallel to the first surface.

B18.1. The method of paragraph B18, wherein the milling the second layer comprises milling along the imaging axis.

B18.2. The method of any of paragraphs B18-B18.1, wherein the milling the second layer comprises performing a diagonal mill of the sample.

B18.2.1. The method of paragraph B18.2, where performing the diagonal mill of the sample comprises: milling a void in the sample proximate to the region of the sample that is being evaluated; depositing a cap material on a wall of the void proximate to the region of the sample that is being evaluated; and wherein milling the first portion of the sample to expose the first surface is initiated by milling a portion of the cap material.

B19. The method of any paragraphs B1-B2.8, wherein the 3D fiducial is milled and/or burned into the sample to such a depth that a cross-section of the 3D fiducial is present in a plurality of images of the sample obtained via slice and view imaging.

B20. The method of any of paragraphs B1-B19, wherein the method further comprises milling a reference fiducial on a surface of the sample that is not removed during slice and view imaging.

C1. A charged particle microscope system, the system comprising: a sample holder configured to hold a sample; an electron beam source configured to emit an electron beam toward the sample; an electron beam column configured to direct the electron beam onto the sample; a delayering component configured to remove a layer from the surface of the sample, the layer having a known thickness; one or more detectors configured to detect emissions resultant from the electron beam irradiating the sample; one or more processors; and a memory storing instructions that when executed on the one or more processors causes the charged particle microscope system to perform the method of any of paragraphs A1-A20 and/or B1-B20.

D1. Use of the system of C1 to perform a method of any of paragraphs A1-A20 and/or B1-B20.

E1. Non-transitory computer readable memory storing instructions that, when executed on a processor, causes a computing device to perform method of any of paragraphs A1-A20 and/or B1-B20.

The systems, apparatus, and methods described herein should not be construed as limiting in any way. Instead, the present disclosure is directed toward all novel and non-obvious features and aspects of the various disclosed embodiments, alone and in various combinations and subcombinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "determine," "identify," "produce," and "provide" to describe the disclosed methods. These terms are high-level abstractions of the actual operations that are performed. The actual operations that correspond to these terms will vary depending on the particular implementation and are readily discernible by one of ordinary skill in the art.

Figure 15:
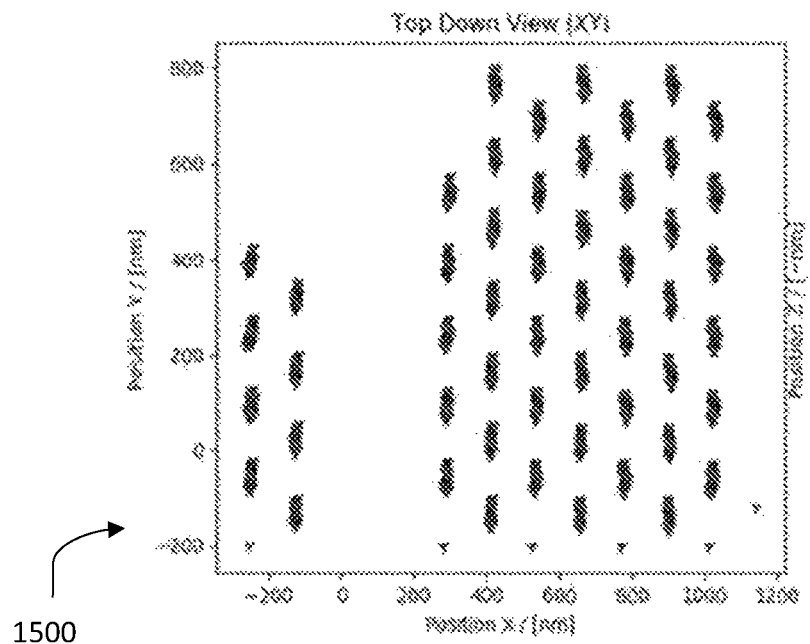
FIG. 15 is a graph 1500 that depicts a top down view.
Figure 16:
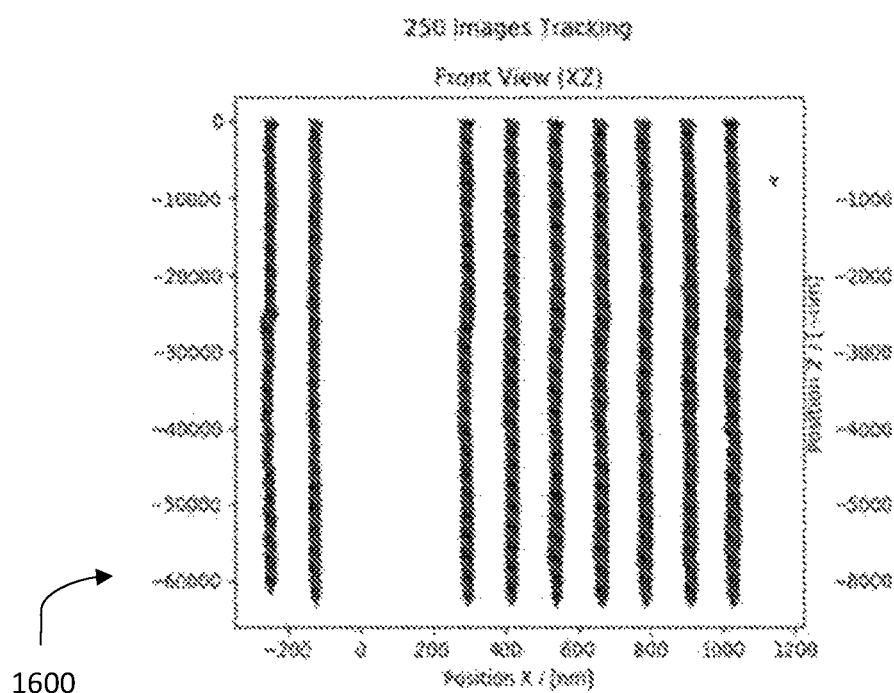
FIG. 16 is a graph 1600 that depicts a front view.
Figure 17:
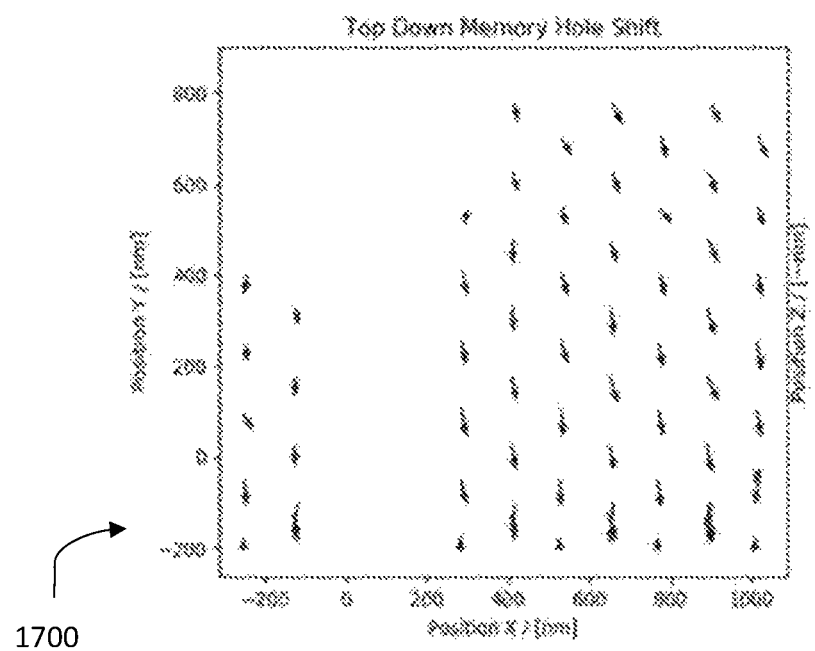
FIG. 17 is a graph 1700 that depicts a top down memory hole shift view.
Figure 18:
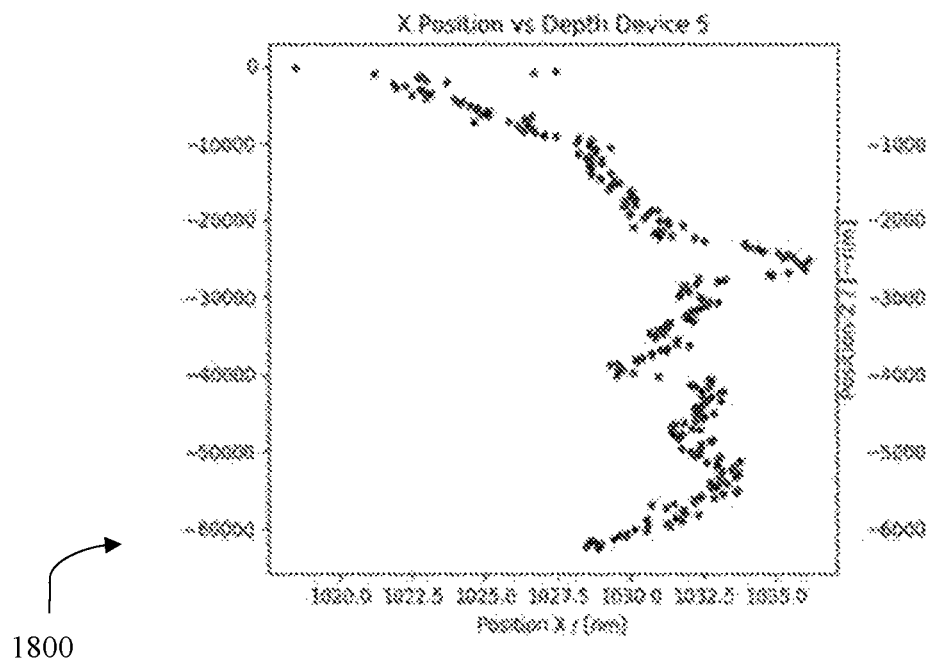
FIG. 18 is a graph 1800 that depicts a X position versus depth view.
Figure 19:
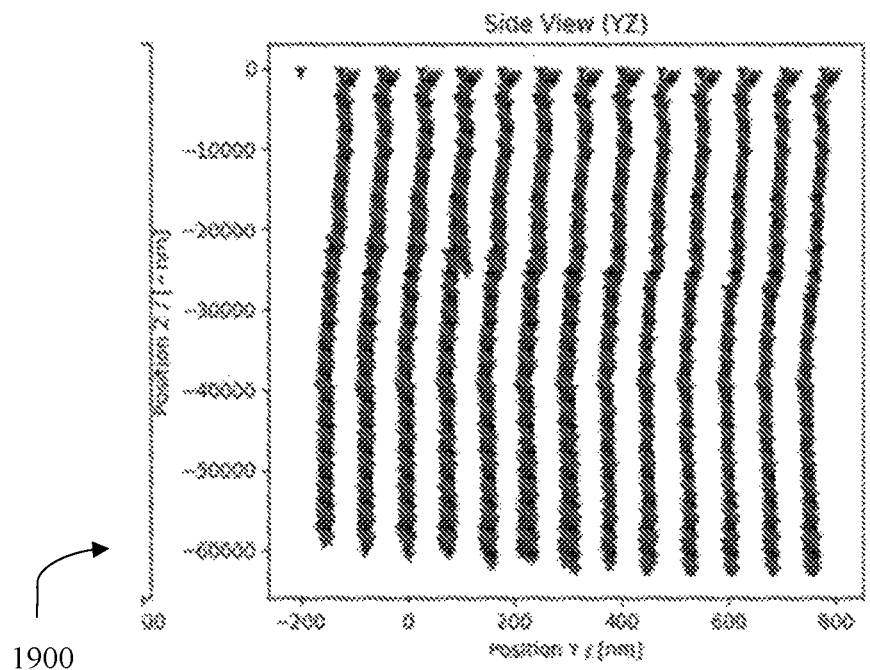
FIG. 19 is a graph 1900 that depicts a side view.
Figure 20:
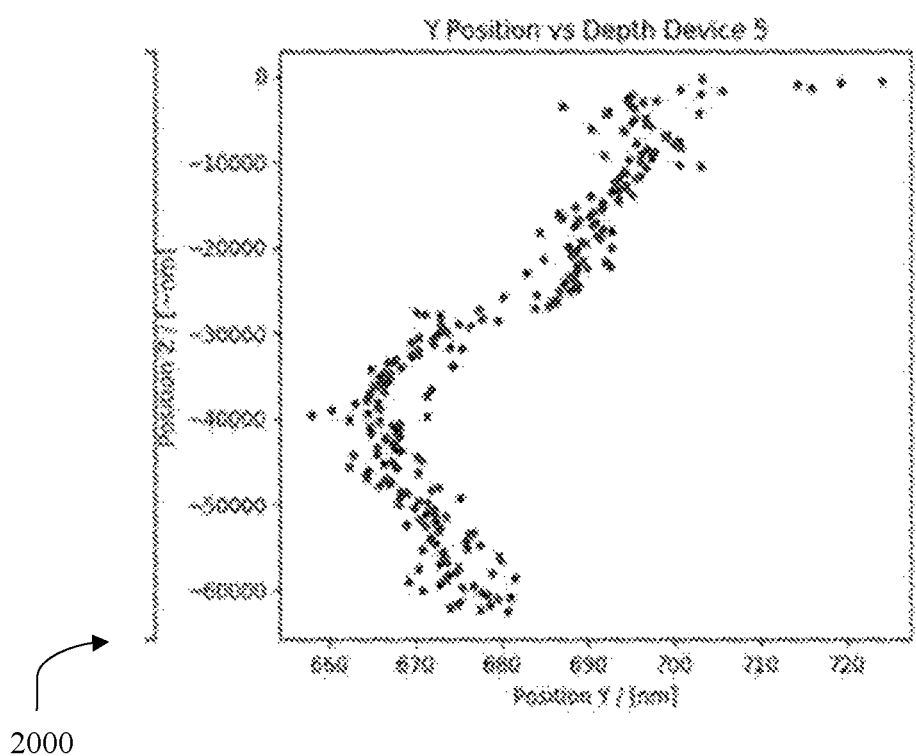
FIG. 20 is a graph 2000 that depicts a Y position versus depth view.

FIG. 15 is a graph 1500 that depicts a top down view. FIG. 16 is a graph 1600 that depicts a front view. FIG. 17 is a graph 1700 that depicts a top down memory hole shift view. FIG. 18 is a graph 1800 that depicts a X position versus depth view. FIG. 19 is a graph 1900 that depicts a side view. FIG. 20 is a graph 2000 that depicts a Y position versus depth view.

What is claimed is:

1. A method for evaluating structures in a sample with a charged particle microscope system, the method comprising:
   generating a 3D fiducial in the sample by generating a 3D void in the sample according to a 3D fiducial configuration, the 3D fiducial having a depth greater than or equal to a depth of the sample, and cross sections of a 3D fiducial generated using the 3D fiducial configuration having a same shape in parallel cross sections;
   milling a first portion of the sample to expose a first surface, the first surface including the 3D fiducial;
   generating a first image within a consistent reference frame determined by the 3D fiducial configuration by imaging at least a portion of the first surface, wherein the portion of the first surface includes the 3D fiducial and a first cross section of a structure in the sample;
   milling a second portion of the sample to expose a second surface after imaging the portion of the first surface, the second surface including the 3D fiducial;
   generating a second image within the consistent reference frame by imaging at least a portion of the second surface, wherein the portion of the second surface includes the 3D fiducial and a second cross section of the structure;
   determining, based on the first image, a first relative position between the 3D fiducial in the first image and the first cross section of the structure;
   determining, based on the second image, a second relative position between the 3D fiducial in the second image and the second cross section of the structure; and
   determining, based on the first relative position and the second relative position, a positional relationship between the first cross section of the structure and the second cross section of the structure,
   wherein, within the consistent reference frame, representative positional values of the 3D fiducial included in the second surface are consistent with representative positional values of the 3D fiducial included in the first surface.

2. The method of claim 1, wherein the 3D fiducial is a milled void having the shape of a prism.

3. The method of claim 1, wherein determining the first relative position comprises:
   determining a reference position of the 3D fiducial in the first image;
   determining a first feature position of the first cross section of the structure in the first image; and
   wherein the first relative position corresponds to the difference between the reference position and the first feature position.

4. The method of claim 3, wherein determining the second relative position comprises:
   determining a reference position of the 3D fiducial in the second image;
   determining a second feature position of the second cross section of the structure in the second image; and
   wherein the second relative position corresponds to the difference between the reference position and the second feature position.

5. The method of claim 1, wherein determining the positional relationship between the first cross section of the structure and the second cross section of the structure comprises:
   determining a global geometric relationship between the 3D fiducial as depicted in the first image and the global geometric relationship between the 3D fiducial as depicted in the second image; and
   determining the positional relationship between the first cross section of the structure and the second cross section of the structure based on the first relative position, the second relative position, and the global geometric relationship.

6. The method of claim 5, wherein determining the global geometric relationship comprises:
   determining a depth of the first surface;
   determining a depth of the second surface; and
   determining, based on the depth of the first surface and the depth of the second surface, the global geometric relationship between the 3D fiducial as depicted in the first image and the global geometric relationship between the 3D fiducial as depicted in the second image.

7. The method of claim 1, wherein the first image further depicts a third cross section of an additional structure, the second image further depicts a fourth cross section of the additional structure, and the method further comprises:
   determining, based on the first image, a third relative position between the 3D fiducial in the first image and the second cross section of the additional structure;
   determining, based on the second image, a fourth relative position between the 3D fiducial in the second image and the fourth cross section of the additional structure; and
   determining, based on the third relative position and the fourth relative position, a positional relationship between the third cross section of the additional structure and the fourth cross section of the additional structure.

8. The method of claim 1, further comprising:
   milling a third portion of the sample to expose a third surface, the third surface including the 3D fiducial;
   imaging at least a portion of the third surface, wherein the portion of the third surface includes the 3D fiducial and a third cross section of the structure;
   determining, based on the third image, a third relative position between the 3D fiducial in the third image and the third cross section of the structure; and
   determining, based on the third relative position and at least one of the first relative position and the second relative position, an additional positional relationship between at least one of the first cross section of the structure and the second cross section of the structure.

9. The method of claim 1, further comprising determining a position of the cross section of the 3D fiducial in the first image, the cross section of the 3D fiducial in the second image, the first cross section of the structure in the first image, and the second cross section of the structure in the second image.

10. The method of claim 1, further comprising identifying that the first cross section of the structure and the second cross section of the structure are part of the sample structure using a pattern recognition algorithm.

11. The method of claim 1, wherein milling the second portion comprises milling a consistent thickness of the sample such that the second surface is parallel to the first surface.

12. The method of claim 1, further comprising:
depositing a cap material on a wall of the 3D void; and
wherein milling the first portion of the sample to expose the first surface comprises performing a diagonal mill through the cap material.

13. The method of claim 1, wherein the 3D fiducial is milled or burned into the sample to such a depth that a cross section of the 3D fiducial is present in a plurality of images of the sample obtained via slice and view imaging.

14. A charged particle microscope system, the charged particle microscope system comprising:
a sample holder of a charged particle microscope configured to hold a sample;
an electron beam source of the charged particle microscope configured to emit an electron beam toward the sample;
an electron beam column of the charged particle microscope configured to direct the electron beam onto the sample;
one or more processors; and
a memory storing instructions that when executed on the one or more processors causes the charged particle microscope system to:
generate a 3D fiducial in the sample by generating a 3D void in the sample according to the 3D fiducial configuration, the 3D fiducial having a depth greater than or equal to a depth of the sample, and cross sections of a 3D fiducial generated using the 3D fiducial configuration having a same shape in parallel cross sections;
remove a first portion of the sample to expose a first surface, the first surface including the 3D fiducial;
generate a first image within a consistent reference frame determined by the 3D fiducial configuration by imaging at least a portion of the first surface, wherein the portion of the first surface includes the 3D fiducial and a first cross section of a structure in the sample;
remove a second portion of the sample to expose a second surface after imaging the portion of the first surface, the second surface including the 3D fiducial;
generate a second image within the consistent reference frame by imaging at least a portion of the second surface, wherein the portion of the second surface includes the 3D fiducial and a second cross section of the structure;
determine, based on the first image, a first relative position between the 3D fiducial in the first image and the first cross section of the structure;
determine, based on the second image, a second relative position between the 3D fiducial in the second image and the second cross section of the structure; and
determine, based on the first relative position and the second relative position, a positional relationship between the first cross section of the structure and the second cross section of the structure,
wherein, within the consistent reference frame, representative positional values of the 3D fiducial included in the second surface are consistent with representative positional values of the 3D fiducial included in the first surface.

15. The charged particle microscope system of claim 14, wherein determining the positional relationship between the first cross section of the structure and the second cross section of the structure comprises:
determining a global geometric relationship between the 3D fiducial as depicted in the first image and the global geometric relationship between the 3D fiducial as depicted in the second image; and
determining the positional relationship between the first cross section of the structure and the second cross section of the structure based on the first relative position, the second relative position, and the global geometric relationship.

16. The charged particle microscope system of claim 15, wherein determining the global geometric relationship comprises:
determining a depth of the first surface;
determining a depth of the second surface; and
determining, based on the depth of the first surface and the depth of the second surface, the global geometric relationship between the 3D fiducial as depicted in the first image and the global geometric relationship between the 3D fiducial as depicted in the second image.

17. The charged particle microscope system of claim 14, wherein the instructions further cause the charged particle microscope system to generate a reconstruction of the structure based at least in part on the positional relationship.

* * * * *